(12) United States Patent
Fritz et al.

(10) Patent No.: US 10,218,332 B2
(45) Date of Patent: Feb. 26, 2019

(54) BROADBAND MATCHING CIRCUIT FOR CAPACITIVE DEVICE

(71) Applicant: Avago Technologies General IP (Singapore) Pte. Ltd., Singapore (SG)

(72) Inventors: Martin Fritz, Bavaria (DE); Hongya Xu, Taufkirchen (DE); Usman Javaid, Unterhaching Munich (DE); Jonathan Bamford, Redwood City, CA (US)

(73) Assignee: Avago Technologies International Sales Pte. Limited, Singapore (SG)

(*) Notice: Subject to any disclaimer, the term of this patent is extended or adjusted under 35 U.S.C. 154(b) by 480 days.

(21) Appl. No.: 14/927,535

(22) Filed: Oct. 30, 2015

(65) Prior Publication Data

US 2017/0126197 A1    May 4, 2017

(51) Int. Cl.
  *H03H 7/38* (2006.01)
  *H03H 7/01* (2006.01)
  *H03H 9/70* (2006.01)
  *H03H 9/72* (2006.01)

(52) U.S. Cl.
  CPC ............ *H03H 7/38* (2013.01); *H03H 7/175* (2013.01); *H03H 9/706* (2013.01); *H03H 9/725* (2013.01)

(58) Field of Classification Search
  CPC .......... H03H 7/175; H03H 7/38; H03H 9/725; H03H 9/706
  USPC .................................. 333/32, 124, 132, 133
  See application file for complete search history.

(56) References Cited

U.S. PATENT DOCUMENTS

| | | | |
|---|---|---|---|
| 6,909,334 B2 | 6/2005 | Ash | |
| 7,164,306 B2* | 1/2007 | Makino | H03H 7/463 327/407 |
| 2009/0002095 A1* | 1/2009 | Terada | H03H 9/725 333/133 |
| 2013/0207872 A1* | 8/2013 | Bakalski | H04B 1/0458 343/860 |

OTHER PUBLICATIONS

D. B. Leeson, "Impedance Matching", EEE 194RF,1994-99, pp. 1-11.

* cited by examiner

*Primary Examiner* — Rakesh Patel
*Assistant Examiner* — Jorge Salazar, Jr.

(57) ABSTRACT

A matching circuit provides broadband impedance matching of first and second devices for processing RF signals in a broadband frequency range, the first device being inherently capacitive. The matching circuit includes a shunt inductor that transforms impedance of the first device to matching impedance at a matching resonance frequency in a middle portion of the broadband frequency range, and a series resonance circuit that has a series resonance frequency approximately the same as the matching resonance frequency. The series resonance circuit includes an inductor and a capacitor connected in series to the first device, and further transforms the matching impedance of the first device and the shunt inductor to a design matching impedance corresponding to the broadband frequency range. One end of the shunt inductor is connected to the first device, between the series resonance circuit and the first device or to an opposite side of the first device.

19 Claims, 18 Drawing Sheets

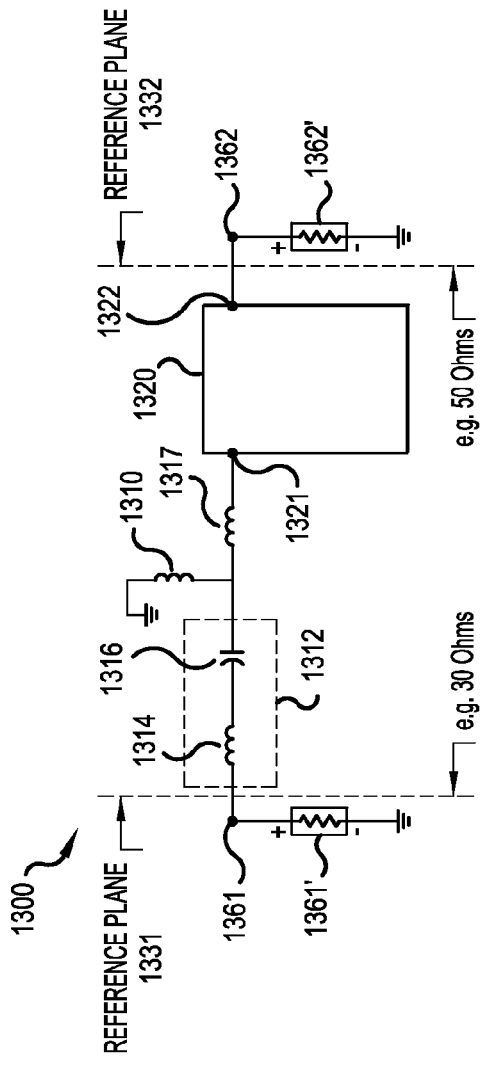
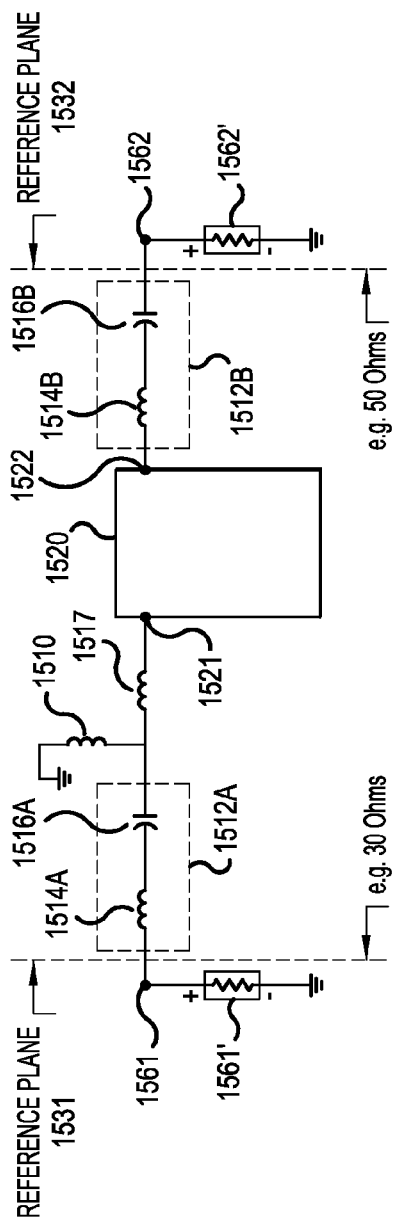
FIG. 13
FIG. 15

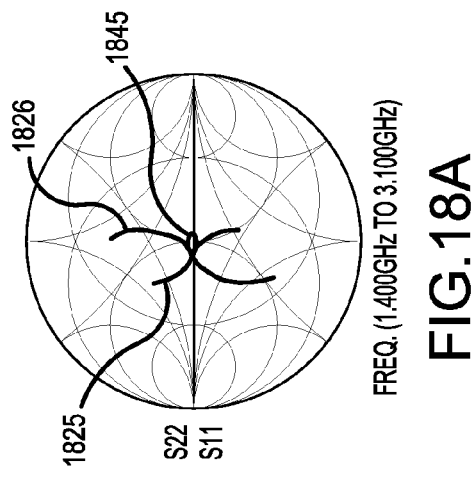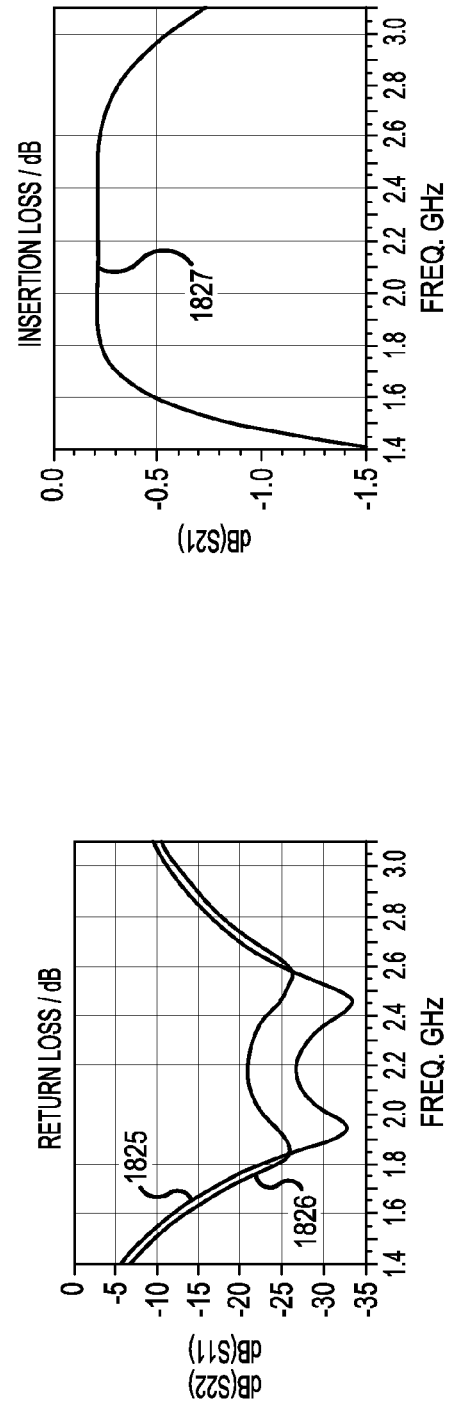
FIG. 18A
FIG. 18B
FIG. 18C

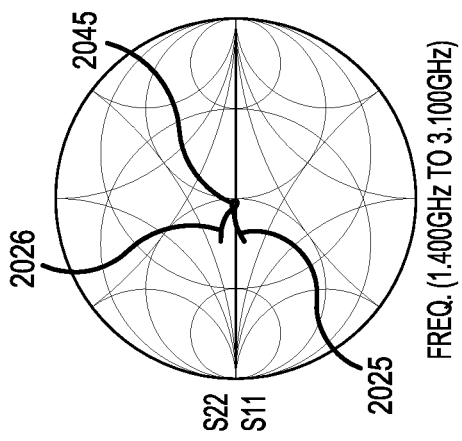
FIG. 20A
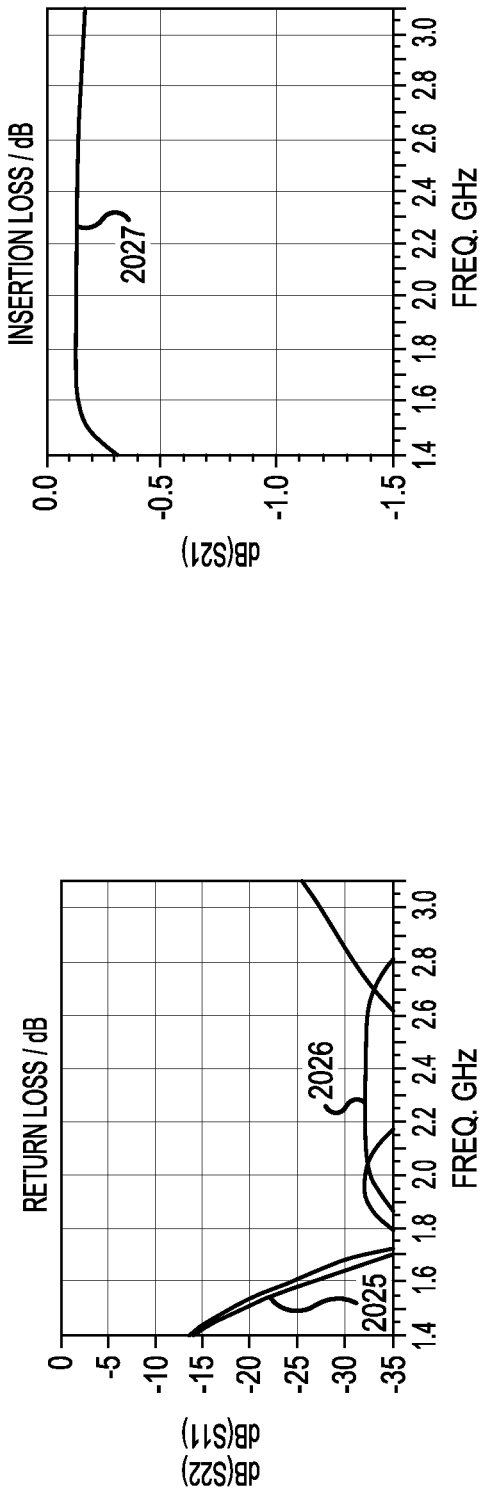
FIG. 20B
FIG. 20C

BROADBAND MATCHING CIRCUIT FOR CAPACITIVE DEVICE

BACKGROUND

Radio frequency (RF) and microwave switches are used to switch between different high frequency transmission paths when the different transmission paths are isolated from each other. Conventional RF and microwave switches are implemented in numerous types of systems, such as test systems, RF front-ends, and the like.

Generally, there are two groups of RF and microwave switches: electromechanical switch and solid state switches. Electromechanical switches use electromagnetic induction to switch among mechanical contacts. Solid state switches, however, do not have moving parts. Due to certain favorable parameters of solid state switches, such as high switching speed, short settling time and long operating life, they typically are used in mobile phone or other RF front-end modules (FEMs) for time division duplex (TDD) applications, such as TDD switched power amplifier duplexer (S-PAD) modules. Since solid state switches are based on semiconductor technologies, such as metal-oxide-semiconductor field-effect transistors (MOSFETs), they inherently have capacitive behavior. This inherently capacitive behavior will act as an impedance transformer which affects the matching of the circuits connected at the switch input and switch output. Even if the circuits connected at switch input and switch output are matched to each other (e.g., both 50 Ohms) by absence of the solid state switch, the solid state switch will lead to a mismatch when added between these two circuits due to its inherently capacitive behavior. Therefore, the capacitive impedance of a solid state switch must be compensated for or transformed to a design impedance (e.g., 50 Ohms) by a matching circuit.

FIG. 1A is a simplified block diagram of a conventional compensation/matching circuit. Conventional compensation/matching circuits typically incorporate a shunt inductor. For example, referring to FIG. 1A, matching circuit 100 includes a single shunt inductor 110 to compensate for the capacitive behavior of the solid state switch 120 (or other comparable inherently capacitive device) to provide matching between the solid state switch 120 (or other comparable inherently capacitive device) and the filter 130 (or other electronic circuit, such as an antenna, a power amplifier, or a common receive (Rx) PAD), for example. The compensation network (e.g., the shunt inductor 110) may alternatively be placed on the opposite side of the solid state switch 120, instead of between switch 120 and device 130, to achieve the same result. Such compensation/matching, however, results in limited bandwidth, which is insufficient for next generation S-PAD modules. Broadband solutions for compensation/matching circuits are needed in various scenarios, such as covering an increased number of mobile bands, using multiple TDD bands simultaneously, using the same antenna for multiple frequency bands, covering multiple frequency bands by a single broadband multiband power amplifier, and combining different receive paths at a common Rx pad.

FIG. 1B is a simplified block diagram of the conventional matching circuit 100 from the perspective of the solid state switch 120. More particularly, the solid state switch 120 has an input port 121 and an output port 122. The design impedance 161' (related to reference ground) at the point of connection (port 161) of the input port 121 to another component (e.g., at reference plane 131) is typically about 50 ohms, and the design impedance 162' (related to ground) at the point of connection of the output port 122 to another component (e.g., at reference plane 132) is also typically about 50 ohms. Notably, indication of the impedances 161' and 162' would not be present when the corresponding input port 121 and output port 122 of the solid state switch 120 are shown connected to other components, such as the filter 130 in FIG. 1A.

The shunt inductor 110 of the conventional matching circuit 100 compensates for the capacitive part of the solid state switch 120 by transforming impedance. For example, FIG. 2A is a Smith chart showing return loss of the solid state switch 120 in an ON state and matching with conventional shunt inductor 110. The shunt inductor 110 is dimensioned so that the entire frequency band (e.g., from 1.8 GHz to 2.7 GHz) is matched as well as possible. Therefore the shunt inductor 110 is dimensioned so that the impedance m1 at the left edge of the frequency band to be matched (e.g., about 1.8 GHz), and the impedance m2 at the right edge of the frequency band to be matched (e.g., about 2.7 GHz) are approximately complex conjugated with respect to one another. Curve 223 between the impedances m1 and m2 represents impedances of the complete frequency band to be matched, where the impedances m1 and m2 are the edges of this frequency band. In this example, for instance, the impedance m1 is indicated as complex number $Z0*(0.720+j0.409)$, and the impedance m2 is indicated as complex number $Z0*(0.722-j0.408)$, where Z0 is the reference impedance used for the Smith chart. The resulting matching resonance frequency is somewhere in the middle of the frequency band to be matched, which in this example is about 2.2 GHz (as indicated by negative peak 222 in FIG. 2B and positive peak 224 in FIG. 2C, discussed below). The impedance m0 in FIG. 2A is the resulting impedance at this matching resonance frequency of the solid state switch 120 by matching with conventional shunt inductor 110. As is evident by the Smith chart, the impedances on the return loss curve 223 in FIG. 2A between the impedance m1 at the left edge of the frequency band to be matched and the impedance m0 approximately at the middle of the frequency band to be matched are inductive, while the impedances on the return loss curve 223 between the impedance m0 and the impedance m2 at the right edge of the frequency band to be matched are capacitive, although the impedances between the impedance m0 and the impedance m2 are less capacitive than the inherently capacitive solid state switch 120 without the shunt inductor 110. The matching resonance frequency is the frequency point at which matching is best (that is, nearly ideal), and therefore lies approximately within the middle of the frequency band to be matched.

FIG. 2B is a graph showing return loss (S-parameter $S_{11}$) of the shunt inductor matched solid state switch 120 in ON state in decibels (dB) at reference plane 131, corresponding to the design impedance 161, as a function of frequency in GHz, and FIG. 2C is a graph showing insertion loss (S-parameter $S_{21}$) of the shunt inductor matched solid state switch 120 in the ON state in dB as a function of frequency in GHz. However, the achieved impedance matching has limited bandwidth, which is not acceptable for next generation TDD (Time Division Duplex) multiband applications. For example, assuming FIGS. 2B and 2C depict return and insertion loss for impedance matching frequency band 38 (2570 MHz-2620 MHz) and frequency band 39 (1880 MHz-1920 MHz) in a composite broadband frequency range using the one shunt inductor 110, the return loss would be only about 10 dB at the left and right edges of the frequency band to be matched, which is not sufficient.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 13 is a simplified block diagram illustrating a matching circuit of a solid state switch for matching a device with the different impedances, according to a representative embodiment.

FIG. 15 is a simplified block diagram illustrating LC series resonance circuits on both sides of a solid state switch for matching devices with different impedance, according to a representative embodiment.

FIG. 18A is a Smith chart showing return loss of a solid state switch in an ON state, with a matching circuit configured as shown in FIG. 17, according to a representative embodiment.

FIG. 18B is a graph showing return loss of the matched solid state switch in an ON state of FIG. 17 as a function of frequency, according to a representative embodiment.

FIG. 18C is a graph showing insertion loss of the matched solid state switch in an ON state of FIG. 17 as a function of frequency, according to a representative embodiment.

FIG. 20A is a Smith chart showing return loss of a solid state switch in an ON state, with a matching circuit configured as shown in FIG. 19, according to a representative embodiment.

FIG. 20B is a graph showing return loss of the matched solid state switch in an ON state of FIG. 19 as a function of frequency, according to a representative embodiment.

FIG. 20C is a graph showing insertion loss of the matched solid state switch in an ON state of FIG. 19 as a function of frequency, according to a representative embodiment.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Figure 1A:
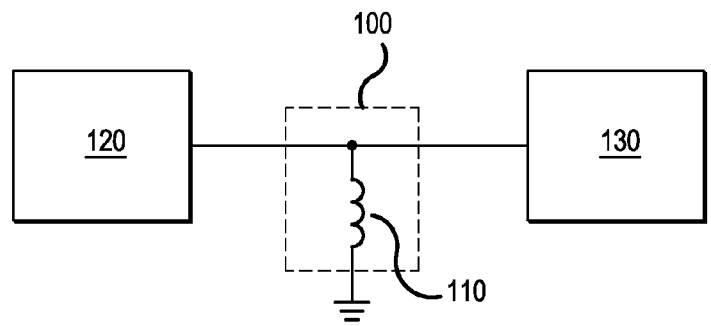
FIG. 1A is a simplified block diagram illustrating a conventional matching circuit.
Figure 1B:
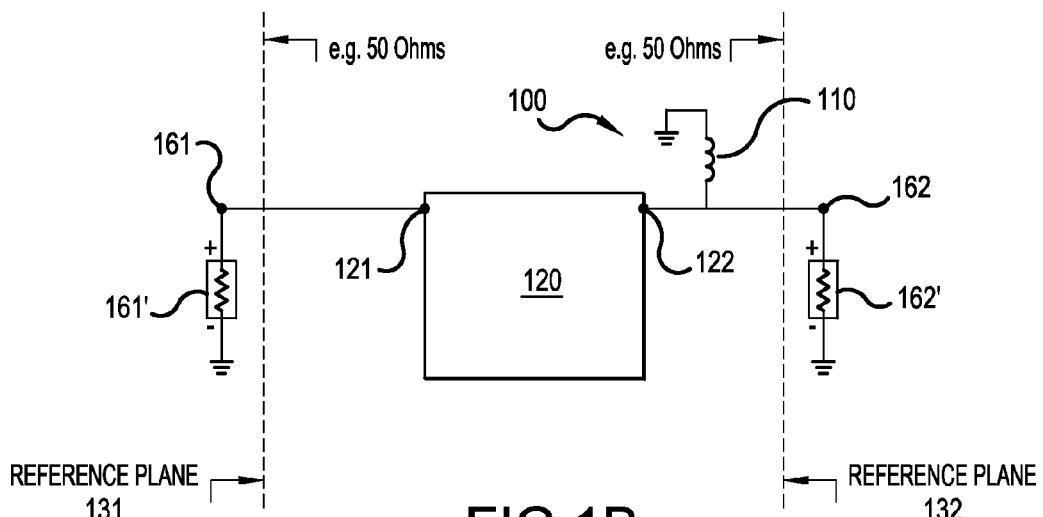
FIG. 1B is a simplified block diagram illustrating a conventional matching circuit for a solid state switch.

A solid state switch is a multiple port device. In the simplest configuration, a solid state switch, such as the solid state switch 120 discussed above, is a two port device having an input port 121 and an output port 122. When the solid state switch 120 is "on," the input port 121 and the output port 122 are connected, thereby conducting the RF signal, although this connection likely has some losses. Notably, in this configuration, the shunt inductor 110 may be connected to the output port 122 (as shown in FIG. 1) or to the input port 121 of the solid state switch 120 to compensate for capacitive behavior of the switch and to provide matching respectively.

Figure 3A:
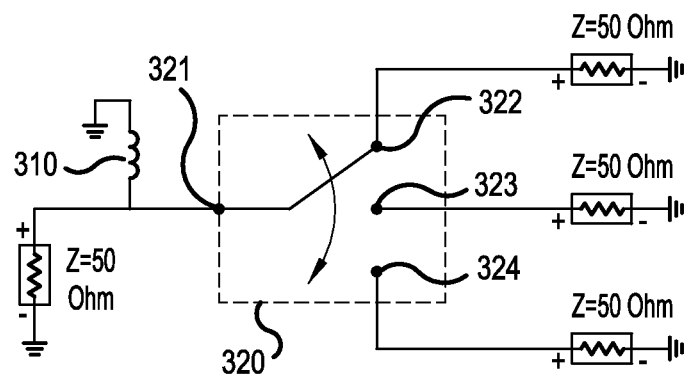
FIG. 3A is a simplified block diagram illustrating a conventional matching circuit connected to a single input port of a solid state switch having multiple output ports.
Figure 3B:
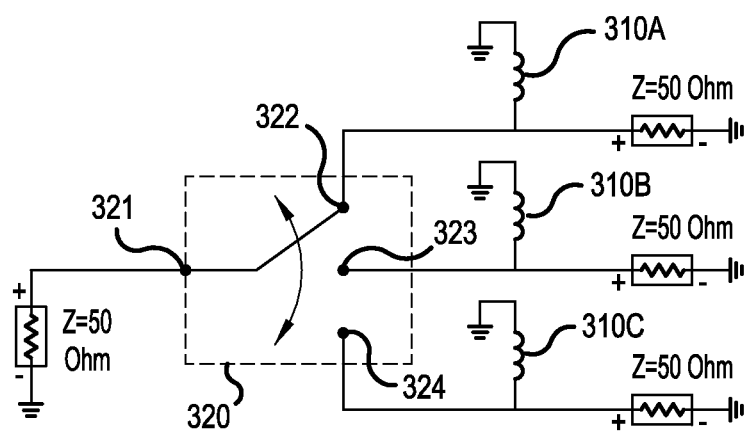
FIG. 3B is a simplified block diagram illustrating conventional matching circuits connected to multiple output ports, respectively, for a solid state switch having a single input port.

Alternative configurations are shown in FIGS. 3A and 3B, which are simplified block diagrams of matching circuits of a solid state switch configured to allow switching between a common input port and multiple output ports or between multiple input ports to a common output port. In particular, FIG. 3A depicts a matching circuit comprising a shunt inductor 310 connected to a common input port 321 of a solid state switch 320, which has three output ports 322, 323 and 324. In comparison, FIG. 3B depicts multiple matching circuits comprising shunt inductors 310A, 310B and 310C respectively connected to the three output ports 322, 323 and 324 of the solid state switch 320, which also has the common input port 321 (with no shunt inductor). Connecting the matching circuit to the common input port 321 is advantageous from the perspective that it reduces the number of required components (shunt inductors). Otherwise, each of the output ports 322, 323 and 324 would need a shunt inductor 310A, 310B and 310C. However, having the multiple shunt inductors 310A, 310B and 310C may be preferable when the output ports already require such elements for tuning or other purposes.

Notably, although FIGS. 3A and 3B are shown with a common input port 321 and multiple output ports 322, 323 and 324, it is understood that the same principles apply to matching circuits for solid state switches having multiple input ports and a common output port. Also, although not necessarily mentioned specifically, the arrangement and functionality of matching circuit(s) for a solid state switch having a common input/output port and multiple output/input ports apply equally to the various embodiments discussed below.

Figure 4A:
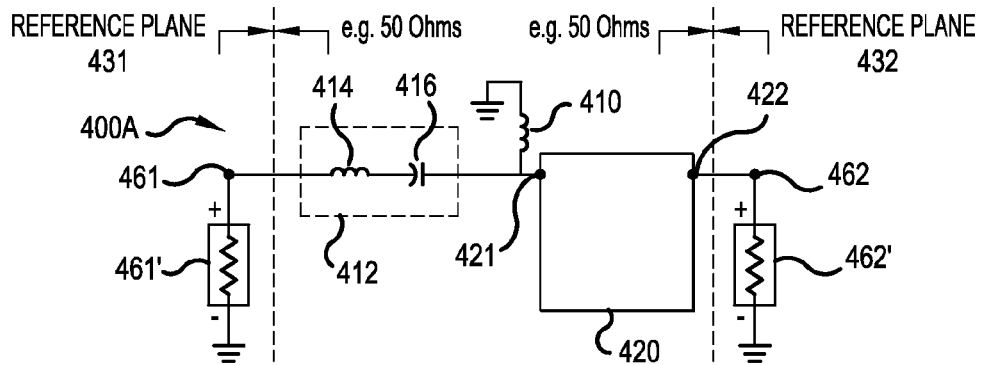
FIG. 4A is a simplified block diagram illustrating a matching circuit of a solid state switch for matching a device with the same impedance, according to a representative embodiment.
Figure 4B:
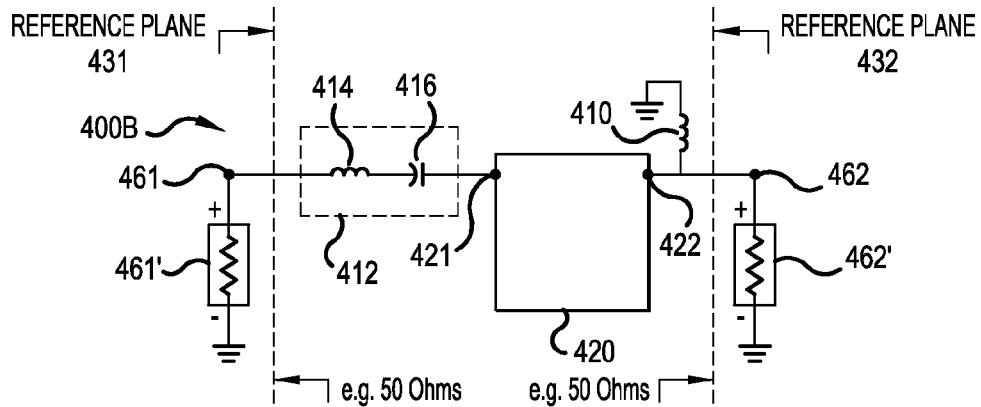
FIG. 4B is a simplified block diagram illustrating a matching circuit of a solid state switch for matching a device with the same impedance, according to a representative embodiment.
Figure 4C:
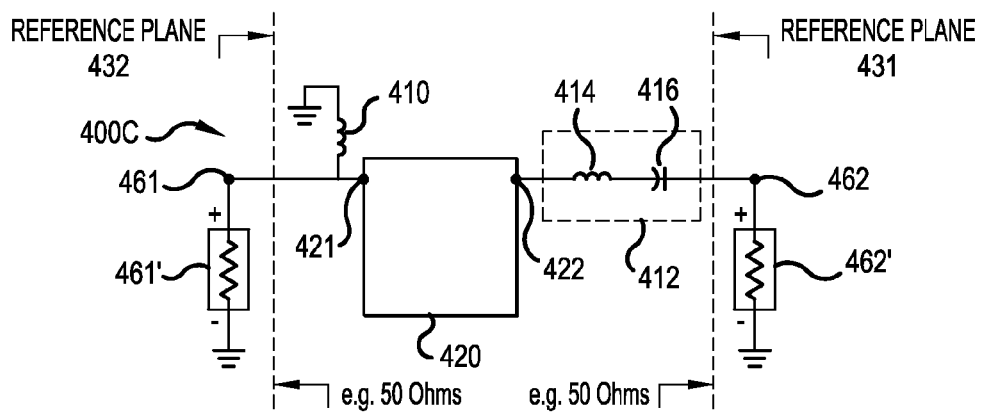
FIG. 4C is a simplified block diagram illustrating a matching circuit of a solid state switch for matching a device with the same impedance, according to a representative embodiment.

FIGS. 4A to 4C are simplified block diagrams illustrating matching circuits of solid state switches for matching devices with the same impedance, according to representative embodiments.

Referring to FIG. 4A, matching circuit 400A is configured to provide broadband impedance matching of a solid state switch 420 (or other comparable inherently capacitive device) at input port 421 and output port 422 for processing RF signals in a broadband frequency range, which may include a single broadband frequency band or multiple limited frequency bands (within a composite broadband frequency range). Impedance 461' is the impedance at the point of connection (port 461) of the input port 421 to another component, which will be referred to as the circuit input port for the sake of convenience. Impedance 462' is the impedance at the point of connection (port 462) of the output port 422 to another component, which will be referred to as the circuit output port for the sake of convenience. The impedances 461' and 462' are to be equal to one another (e.g., each about 50 ohms), and are related to reference ground (as are the other impedances discussed herein).

In the depicted embodiment, the matching circuit 400A includes a shunt inductor 410 and an LC series resonance circuit 412, which has a corresponding series resonance frequency, connected to the input port 421 of the solid state switch 420. The LC series resonance circuit 412 includes an inductor 414 and a capacitor 416 as series elements, which can be arranged in any order with respect to one another. Referring to the LC series resonance circuit 412, the inductor 414 is referred to as an "inductor" for the sake of convenience, although it is understood that the inductor 414 (as well as any other "inductor" identified in the present disclosure) may be implemented by any element(s) having primarily inductive characteristics, such as a transmission line, a bondwire and/or an inductor, for example, depending on the exact value needed to accommodate the matching functionality. Similarly, the capacitor 416 is referred to as a "capacitor" for the sake of convenience, although it is understood that the capacitor 416 (as well as any other "capacitor" identified in the present disclosure) may be implemented by any element(s) have primarily capacitive characteristics. In the depicted embodiment, one end of the shunt inductor 410 is connected between the LC series resonance circuit 412 and the solid state switch 420, and the other end of the shunt inductor 410 is connected to reference ground.

Referring to FIG. 4B, matching circuit 400B is configured to provide broadband impedance matching of the solid state switch 420 at the input port 421 and the output port 422 in substantially the same manner as discussed above with reference to FIG. 4A. In the depicted embodiment, the matching circuit 400B includes the shunt inductor 410 and the LC series resonance circuit 412. However, unlike the matching circuit 400A, the shunt inductor 410 is connected to the output port 422, while the LC series resonance circuit 412 is connected to the input port 421 of the solid state switch 420. That is, one end of the shunt inductor 410 is connected to the output port 422, and the other end of the shunt inductor 410 is connected to reference ground. As discussed above, the LC series resonance circuit 412 includes the inductor 414 and the capacitor 416 as series elements, which can be arranged in any order with respect to one another. Otherwise, the matching circuit 400B functions in substantially the same manner as discussed with reference to the matching circuit 400A.

Referring to FIG. 4C, matching circuit 400C is configured to provide broadband impedance matching of the solid state switch 420 at the input port 421 and the output port 422 in substantially the same manner as discussed with reference to FIG. 4A. In the depicted embodiment, the matching circuit 400C includes the shunt inductor 410 and the LC series resonance circuit 412. However, unlike the matching circuit 400A, the shunt inductor 410 is connected to the input port 421, while the LC series resonance circuit 412 is connected to the output port 422 of the solid state switch 420 (effectively the opposite configuration of the matching circuit 400B). That is, one end of the shunt inductor 410 is connected to the input port 421, and the other end of the shunt inductor 410 is connected to reference ground. As discussed above, the LC series resonance circuit 412 includes the inductor 414 and the capacitor 416 as series elements, which can be arranged in any order with respect to one another. Otherwise, the matching circuit 400C functions in substantially the same manner as discussed with reference to the matching circuit 400A.

In sum, since the input port 421 and the output port 422 may be interchanged by the solid state switch 420 (or other comparable inherently capacitive device), it is generally immaterial at which side of the solid state switch 420 the components (e.g., shunt inductor 410, LC series resonance circuit 412) of the matching circuit (e.g., matching circuits 400A, 400B and 400C) are placed, meaning the components connected to the input port 421 of the solid state switch 420 can alternatively be connected to the output port 422, and vice versa. As mentioned above, if the solid state switch 420 were configured to enable switching among two or more output ports/input ports to a common input port/common output port, respectively (as shown in FIGS. 3A and 3B, for example), it may be advantageous to place the components of the matching circuit at the common input port/common output port to reduce the number of components. However, under various circumstances, it may make sense to place all or some of the components of the matching circuit at the multiple output ports/input ports provided they already require such components for tuning or other purposes.

FIG. 5A is a Smith chart showing return loss of the solid state switch 420 in an ON state (unless otherwise stated, the Smith charts and other graphs throughout the description are determined with the corresponding solid state switch(es) in an ON state throughout this description), with matching circuit 400A configured as shown in FIG. 4A (although FIG. 5A would apply substantially the same to the solid state switch 420 with matching circuit 400B or 400C in FIG. 4B or 4C). The Smith chart shows curve 523 representing impedances of a frequency band (e.g., 1.4 GHz to 3.1 GHz) that includes the complete frequency band to be matched between the respective edges of this frequency band (e.g., 1.8 GHz to 2.7 GHz). Curve 521 shows S-parameter $S_{11}$ (forward reflection coefficient) at reference plane 431 and curve 522 shows S-parameter $S_{22}$ (reverse reflection coefficient) at reference plane 432 of the matched solid state switch 420.

Figure 2A:
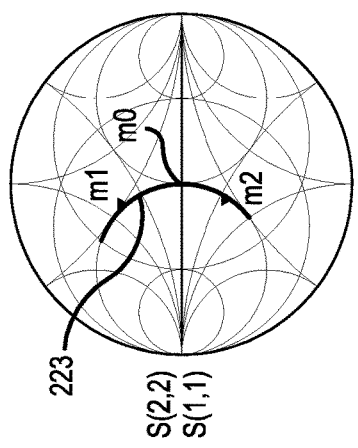
FIG. 2A is a Smith chart showing return loss of an impedance matched solid state switch in an ON state using the conventional matching circuit of FIG. 1B.
Figure 6B:
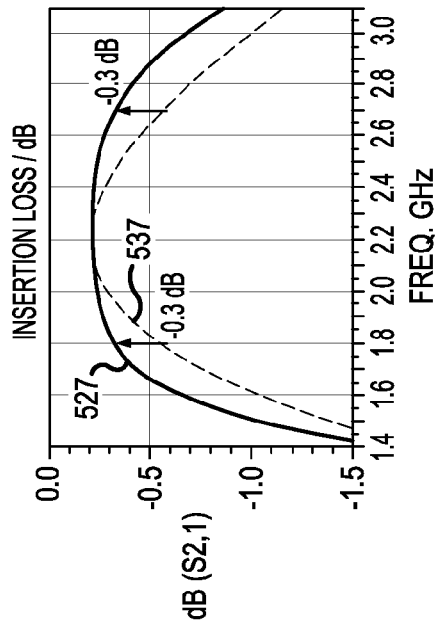
FIG. 6B is a graph showing insertion loss of the matched solid state switch of FIG. 4A as a function of frequency, according to a representative embodiment.
Figure 6A:
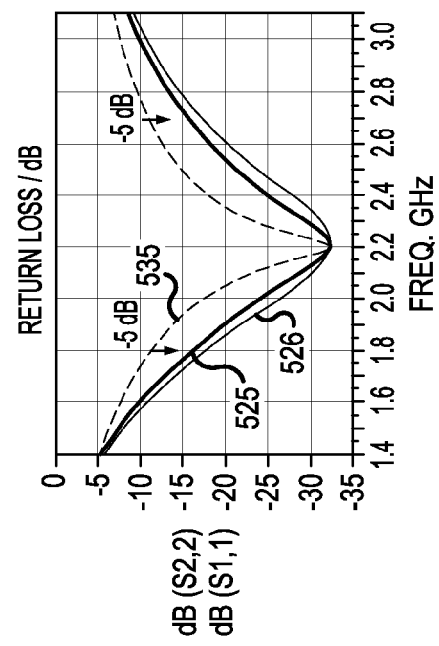
FIG. 6A is a graph showing return loss of the matched solid state switch of FIG. 4A as a function of frequency, according to a representative embodiment.

The series resonance circuit 412, in addition to the shunt inductor 410, transform the impedance further than shown in the Smith chart of FIG. 2A, for example. The series resonance circuit 412, which acts as a capacitive element below its series resonance frequency and acts as an inductive element above its series resonance frequency, will at least partially compensate for the inductive and capacitive behavior of the inherently capacitive solid state switch 420, together with the shunt inductor 410. This compensation is indicated by loop 545 in the $S_{11}$ curve 521 of the Smith chart, formed due to the series resonance circuit 412, which improves in particular matching at the edges of the frequency band to be matched (passband edges) in this example by about 5 dB return loss and by about 0.3 dB insertion loss, as shown in FIGS. 6A and 6B, respectively. The series resonance frequency of the series resonance circuit 412 is approximately the same frequency as the matching resonance frequency.

Figure 2C:
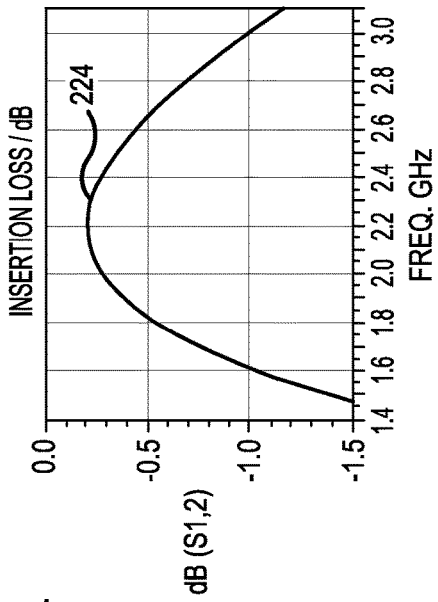
FIG. 2C is a graph showing insertion loss of an impedance matched solid state switch in an ON state as function of frequency using the conventional matching circuit of FIG. 1B.
Figure 2B:
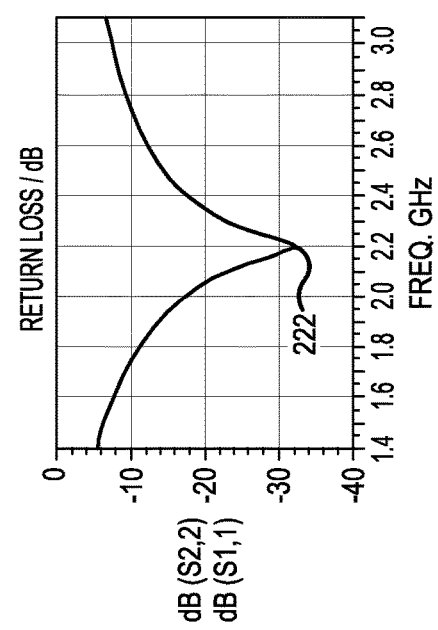
FIG. 2B is a graph showing return loss of an impedance matched solid state switch in an ON state as function of frequency using the conventional matching circuit of FIG. 1B.

FIG. 6A is a graph showing return loss of the matched solid state switch 420 in decibels (dB) as a function of frequency in GHz, and FIG. 6B is a graph showing insertion loss of the matched solid state switch 420 in dB as a function of frequency in GHz. Referring to FIG. 6A, curve 525 indicates the return loss of the matched solid state switch 420 at the reference plane 431 (S-parameter $S_{11}$), and curve 526 indicates the return loss of the matched solid state switch 420 at reference plane 432 (S-parameter $S_{22}$). For purposes of comparison, dashed curve 535 is provided to indicate the return losses of the conventional matched solid state switch 120 (as shown in FIG. 2B), which is substantially the same at the reference plane 431 and reference plane 432. As mentioned above, curve 525 shows an improvement in return loss of about 5 dB at about 1.8 GHz and about 2.7 GHz of the composite broadband frequency range, as compared to dashed curve 535, due to the addition of the LC series resonance circuit 412, together with the shunt inductor 410.

Similarly, referring to FIG. 6B, curve 527 indicates the insertion loss of the matched solid state switch 420 between ports 461 and 462 (S-parameter $S_{21}$). For purposes of comparison, dashed curve 537 is provided to indicate the insertion loss of a conventional matched solid state switch 120 between ports 161 and 162 (e.g., as shown in FIG. 2C). As mentioned above, curve 527 shows an improvement in insertion loss of about 0.3 dB at about 1.8 GHz and about 2.7 GHz of the composite broadband frequency range, as compared to dashed curve 537, due to the addition of the LC series resonance circuit 412, together with the shunt inductor 410.

Figure 7:
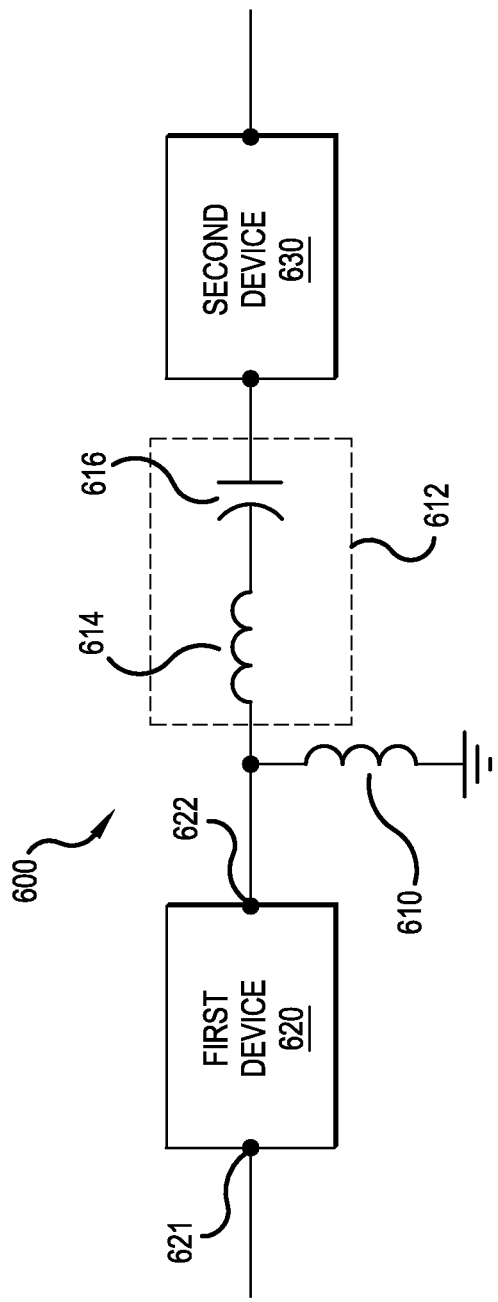
FIG. 7 is a simplified block diagram illustrating a matching circuit between first and second devices, according to a representative embodiment.

FIG. 7 is a simplified block diagram illustrating a matching circuit, according to a representative embodiment, between first and second devices.

Referring to FIG. 7, matching circuit 600 is configured to provide broadband impedance matching of a first device 620 (e.g., a solid state switch or other comparable inherently capacitive device) and second device 630 (e.g., a filter, an antenna, a power amplifier, a common receive (Rx) PAD or other electronic device) for processing RF signals in a broadband frequency range, which may include a single broadband frequency band or multiple limited frequency bands within a composite broadband frequency range. The first and second devices 620 and 630 may also be referred to as source and load, respectively. An example of the composite broadband frequency range may span from about 1800 MHz to about 2700 MHz, and may include multiple time division duplex (TDD) frequency bands, such as frequency band 34 (2010 MHz-2025 MHz), frequency band 38 (2570 MHz-2620 MHz), frequency band 39 (1880 MHz-1920 MHz), frequency band 40 (2300 MHz-2400 MHz), and frequency band 41 (2496 MHz-2690 MHz). Of course, different broadband frequency ranges and/or different combinations of frequency bands included therein may be incorporated without departing from the scope of the present teachings.

In the depicted embodiment, the matching circuit 600 is similar to the matching circuit 400A of FIG. 4A, except that it is arranged entirely at the output port 622 of the first device 620 (as opposed to the input port 621). The matching circuit 600 includes a shunt inductor 610 and an LC series resonance circuit 612, which has a corresponding series resonance frequency, connected between the first and second devices 620 and 630. The LC series resonance circuit 612 includes an inductor 614 and a capacitor 616 as series elements which can be arranged in any order with respect to one another. Referring to the LC series resonance circuit 612, the inductor 614 may be implemented by any element(s) having primarily inductive characteristics, such as a transmission line, a bondwire and/or an inductor, for example, depending on the exact value needed to accommodate the matching functionality. Similarly, the capacitor 616 may be implemented by any element(s) have primarily capacitive characteristics. One end of the shunt inductor 610 is connected between the LC series resonance circuit 612 and the first device 620, and the other end of the shunt inductor 610 is connected to reference ground.

As discussed above, the shunt inductor 610 is configured to transform the impedances of the first device at the left and right edges of the frequency band to be matched so that they are approximately complex conjugated with respect to one another as described above. Out of this condition, a matching resonance frequency results. In comparison, operation frequency is the frequency range in which the matching circuit is applicable. That is, the operation frequency is the frequency band over which the broadband impedance matching is applicable for operation of the first device 620 and the second device 630. Since the matching resonance frequency is usually one frequency, the operation frequency is usually a frequency band to be matched, such as the frequency bands of the composite broadband frequency range to be supported by the matching circuit 600.

The matching resonance frequency is in the frequency band (e.g., of the multiple frequency bands) to be matched, that is, substantially centered between the low and high frequency boundaries, as discussed above. Therefore, the imaginary part of the transformed impedance of the first device 620 is due to the shunt inductor 610 being capacitive (although less capacitive) for frequencies greater than the matching resonance frequency, and the impedance is now inductive for frequencies less than the matching resonance frequency.

The LC series resonance circuit 612 of the matching circuit 600 is configured to further transform the matching impedance of the first device 620 and the shunt inductor 610 to a design matching impedance corresponding to the broadband frequency range. To accomplish this, the LC series resonance circuit 612 is added because it acts as a capacitive element for frequencies less than its series resonance frequency, and acts as an inductive element for frequencies greater than its series resonance frequency. Accordingly, the addition of the inductor 614 and the capacitor 616 as the LC series resonance circuit 612 achieves the required broadband impedance matching. The series resonance frequency of the LC series resonance circuit 612 is likewise in the frequency band to be matched, typically in a middle portion of the frequency band, and is approximately the same as the matching resonance frequency.

It is possible to calculate approximate values of the shunt inductor 610, the inductor 614 and the capacitor 616 using equations. However, due to deviations in physical realization, such as available values of surface mounted devices (SMDs), parasitic effects and tolerances, for example, the accurate values typically may be found using a commercial optimizer.

Figure 8A:
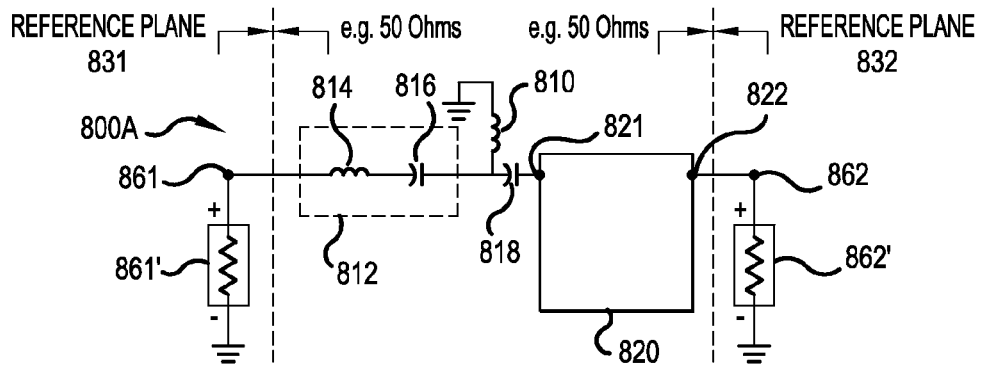
FIG. 8A is a simplified block diagram illustrating a matching circuit of a solid state switch for matching a device with the same impedance and having additional series element, according to a representative embodiment.
Figure 8B:
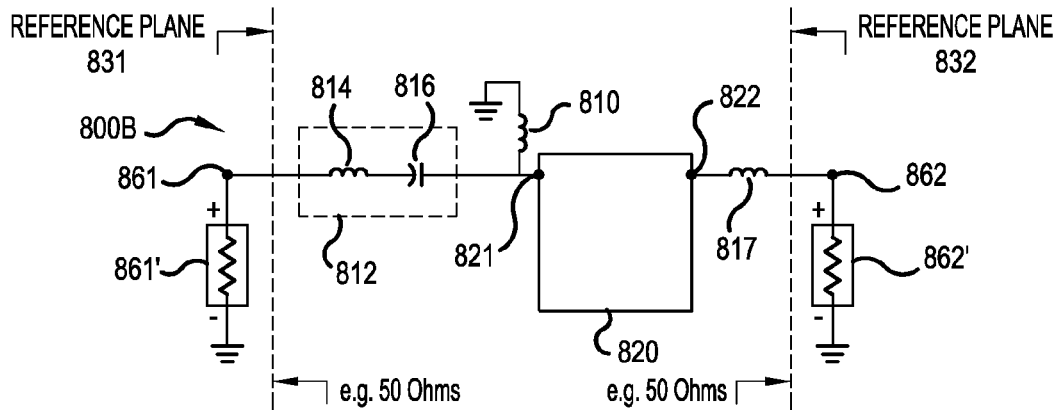
FIG. 8B is a simplified block diagram illustrating a matching circuit of a solid state switch for matching a device with the same impedance and having additional series element, according to a representative embodiment.
Figure 8C:
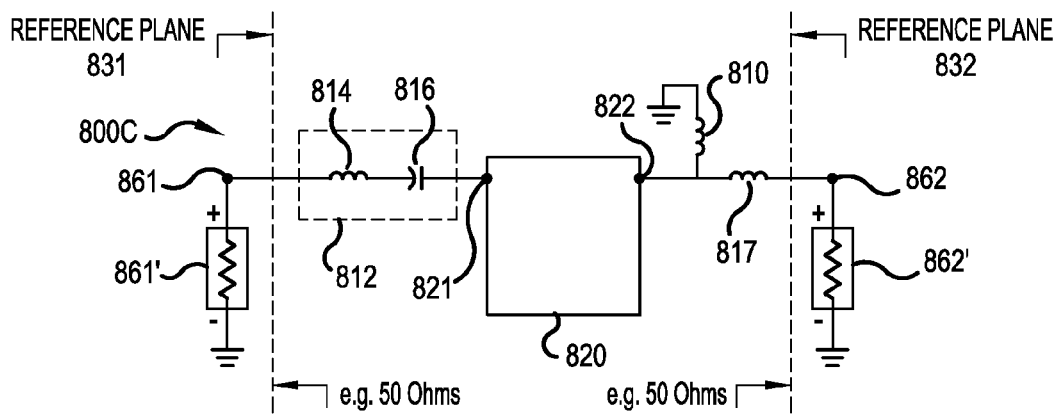
FIG. 8C is a simplified block diagram illustrating a matching circuit of a solid state switch for matching a device with the same impedance and having additional series element, according to a representative embodiment.

FIGS. 8A to 8C are simplified block diagrams illustrating matching circuits of solid state switches for matching devices with the same impedance, each of which includes an additional series element in series with the series resonance circuit, according to representative embodiments.

Referring to FIG. 8A, matching circuit 800A is configured to provide broadband impedance matching of a solid state switch 820 (or other comparable inherently capacitive device) at input port 821 and output port 822 for processing RF signals in a broadband frequency range, which may include a signal broadband frequency band or multiple limited frequency bands within a composite broadband frequency range, as mentioned above. Impedance 861' (related to reference ground) at the point of connection (port 861) of the input port 821 to another component (e.g., at reference plane 831) is typically about 50 ohms. Impedance 862' (related to reference ground) at the point of connection (port 862) of the output port 822 to another component (e.g., at reference plane 832) is also typically about 50 ohms.

In the depicted embodiment, the matching circuit 800A includes a shunt inductor 810, an LC series resonance circuit 812, which has a corresponding series resonance frequency, and an additional series capacitor 818 connected between the input port 821 of the solid state switch 820 and port 861. The LC series resonance circuit 812 includes an inductor 814 and a capacitor 816 as series elements (arranged in any order). In the depicted embodiment, one end of the shunt inductor 810 is connected between the LC series resonance circuit 812 and the additional series capacitor 818, and the other end of the shunt inductor 810 is connected to reference ground.

Referring to FIG. 8B, matching circuit 800B is configured to provide broadband impedance matching of the solid state switch 820 (or other comparable inherently capacitive device) at the input port 821 and the output port 822 in substantially the same manner as discussed with reference to FIG. 8A. In the depicted embodiment, the matching circuit 800B includes the shunt inductor 810, the LC series resonance circuit 812, and an additional series inductor 817. The shunt inductor 810 is connected to the input port 821 of the solid state switch 820. That is, one end of the shunt inductor 810 is connected between the LC series resonance circuit 812 and the input port 821, and the other end of the shunt inductor 810 is connected to reference ground. The matching circuit 800B differs from the matching circuit 800A, discussed above, in that it includes the additional series inductor 817 instead of an additional series capacitor 818, and the additional series inductor 817 is arranged on the opposite side of the solid state switch 820 from the LC series resonance circuit 812. More particularly, the LC series resonance circuit 812 includes the inductor 814 and the capacitor 816 as series elements, which can be arranged in any order with respect to one another, connected in series to the input port 821 of the solid state switch 820, while the additional series inductor 817 is connected in series with the output port 822 of the solid state switch 820. In an alternative configuration, the LC series resonance circuit 812 and the shunt inductor 810 may be connected to the output port 822, and the additional series inductor 817 may be connected to the input port 821 of the solid state switch 820, without departing from the scope of the present teachings.

Referring to FIG. 8C, matching circuit 800C is configured to provide broadband impedance matching of the solid state switch 820 (or other comparable inherently capacitive device) at the input port 821 and the output port 822 in substantially the same manner as discussed with reference to FIG. 8B. In the depicted embodiment, the matching circuit 800C includes the shunt inductor 810, LC series resonance circuit 812, and additional series inductor 817, although the shunt inductor 810 is connected to the output port 822 of the solid state switch 820, as opposed to the input port 821. That is, one end of the shunt inductor 810 is connected between the output port 822 and the additional series inductor 817, and the other end of the shunt inductor 810 is connected to reference ground. The LC series resonance circuit 812 is the same as discussed above. In an alternative configuration, the LC series resonance circuit 812 may be connected to the output port 822, and the shunt inductor 810 and the additional series inductor 817 may be connected to the input port 821 of the solid state switch 820, without departing from the scope of the present teachings.

Figure 9A:
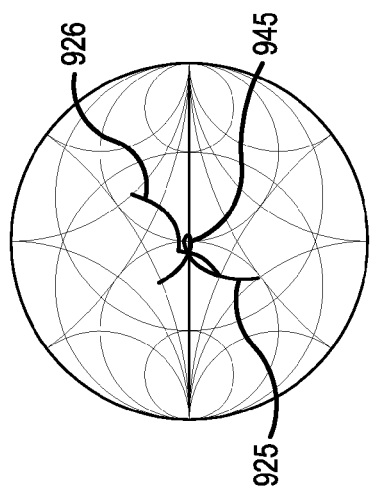
FIG. 9A is a Smith chart showing return loss of a solid state switch in an ON state, with a matching circuit configured as shown in FIG. 8A, according to a representative embodiment.

FIG. 9A is a Smith chart showing return loss of the solid state switch 820, with matching circuit 800A configured as shown in FIG. 8A (although FIG. 9A would apply substantially the same to the solid state switch 820 with matching circuit 800B or 800C in FIG. 8B or 8C). The series resonance circuit 812 and the additional series capacitor 818, in addition to the shunt inductor 810, transform the impedance further than shown in the Smith chart of FIG. 4A, for example. The series resonance circuit 812 and the additional series capacitor 818 will at least partially compensate for the inductive and capacitive behavior of the inherently capacitive solid state switch 820, together with the shunt inductor 810. This compensation is indicated by loop 945 in the Smith chart, due to the series resonance circuit 812 and the additional series capacitor 818, where the loop 945 itself is formed by the series resonance circuit 812 and is shifted to slightly higher impedances by the additional series capacitor 818, which splits the single return loss notch (e.g., as shown in FIG. 6A) into two notches (as shown in FIG. 9B), resulting in more bandwidth. The Smith chart includes curve 925 showing S-parameter $S_{11}$ (forward reflection coefficient) and curve 926 showing S-parameter $S_{22}$ (reverse reflection coefficient) of the matched solid state switch 820. In the depicted embodiment, $S_{11}$ curve 925 corresponds to input port 821 (at reference plane 831) to which the LC series resonance circuit 812 and the additional series capacitor 818 are connected.

Figure 5:
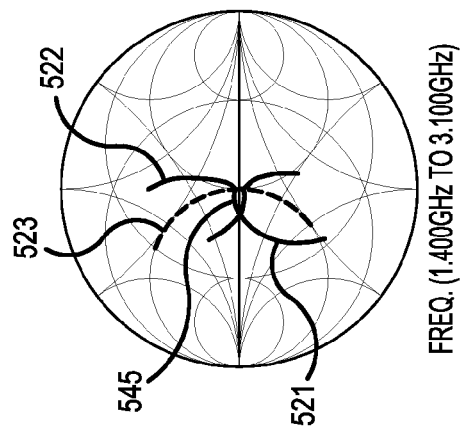
FIG. 5 is a Smith chart showing return loss of a solid state switch in an ON state, with a matching circuit configured as shown in FIG. 4A, according to a representative embodiment.

In the depicted example, since the loop 545 in the Smith chart shown in FIG. 5 is not "symmetrical" around the matching point (e.g., 50 Ohms), the additional series capacitor 818 is placed between the inherently capacitive solid state switch 820 and the shunt inductor 810, as shown in FIG. 8A, resulting in loop 945 in the Smith chart which is now "symmetrical" around the matching point (e.g., 50 Ohms). Alternatively, the additional series inductor 817 may be placed between the inherently capacitive solid state switch 820 and port 862, as shown in FIGS. 8B and 8C. The additional series elements in the various configurations thus further improve matching in particular at the edges of the frequency band to be matched (passband edges) in this example by about 8 dB return loss and by about 0.1 dB insertion loss, as shown in FIGS. 9B and 9C, respectively.

Determining which series element (additional series inductor 817 or additional series capacitor 818) to add depends on which side of the solid state switch 820 the designer wishes to include the additional series element. Therefore it is possible to choose the additional series element that is felicitous in regard to the technology, providing unique benefits for any particular situation or meeting application specific design requirements of various implementations, as would be apparent to one skilled in the art. When adding the additional series element, the other components (e.g., the shunt inductor 810, the inductor 814, and the capacitor 816) must be fine tuned. However, the dimensioning is substantially the same as described above, or can be accomplished through optimization using a commercial optimizer as described above.

Figure 9C:
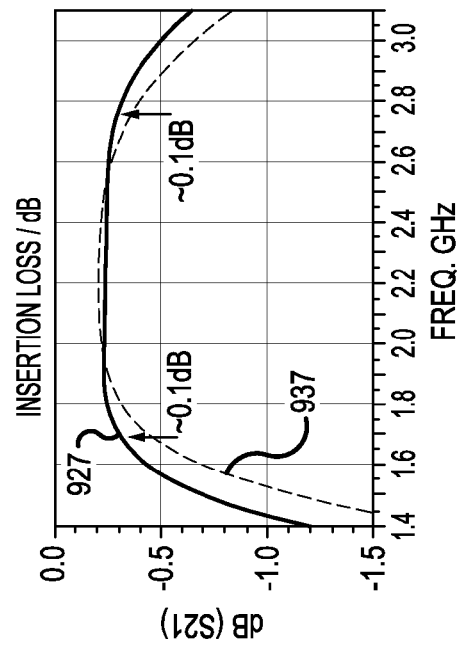
FIG. 9C is a graph showing insertion loss of the matched solid state switch in an ON state of FIG. 8A as a function of frequency, according to a representative embodiment.
Figure 9B:
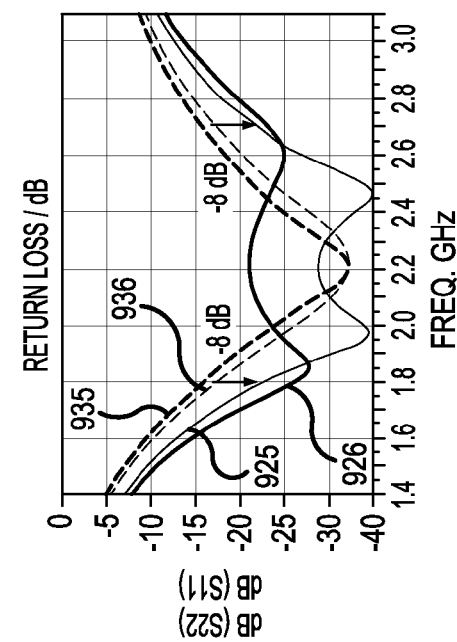
FIG. 9B is a graph showing return loss of the matched solid state switch in an ON state of FIG. 8A as a function of frequency, according to a representative embodiment.

FIG. 9B is a graph showing return loss of the matched solid state switch 820 in dB as a function of frequency in GHz, and FIG. 9C is a graph showing insertion loss of the matched solid state switch 820 in dB as a function of frequency in GHz. Referring to FIG. 9B, curve 925 indicates the return loss of the matched solid state switch 820 at the reference plane 831 (S-parameter $S_{11}$), and curve 926 indicates the return loss of the matched solid state switch 820 at reference plane 832 (S-parameter $S_{22}$). For purposes of comparison, dashed curve 935 is provided to indicate the return loss of the matched solid state switch 420 at the reference plane 431, and dashed curve 936 is provided to indicate the return loss of the matched solid state switch 420 at the reference plane 432, where the match of the matching circuit 400A does not include the additional series element. As mentioned above, curve 925 shows an improvement in return loss of about 8 dB at about 1.8 GHz and about 2.7 GHz, as compared to dashed curve 935, and curve 926 shows also an improvement in return loss of about 8 dB at about 1.8 GHz and about 2.7 GHz, as compared to dashed curve 936, due to the additional series element in the LC series resonance circuit 812. This is because the single notch mentioned above with respect to the matching circuit 400A in FIG. 4A is now split into two notches due to the additional series capacitor 818. This can also be seen in the Smith chart in FIG. 9A with "symmetrical" loop 945 around the matching point, as discussed above.

Similarly, referring to FIG. 9C, curve 927 indicates the insertion loss of the matched solid state switch 820 regarding ports 861 and 862 (S-parameter $S_{21}$). For purposes of comparison, dashed curve 937 is provided to indicate the insertion loss of the matched solid state switch 420. As mentioned above, curve 927 shows an improvement in insertion loss of about 0.1 dB at about 1.8 GHz and about 2.7 GHz of the composite broadband frequency range, as compared to dashed curve 937, due to the additional series element, additional series inductor 817 or additional series capacitor 818.

Figure 10:
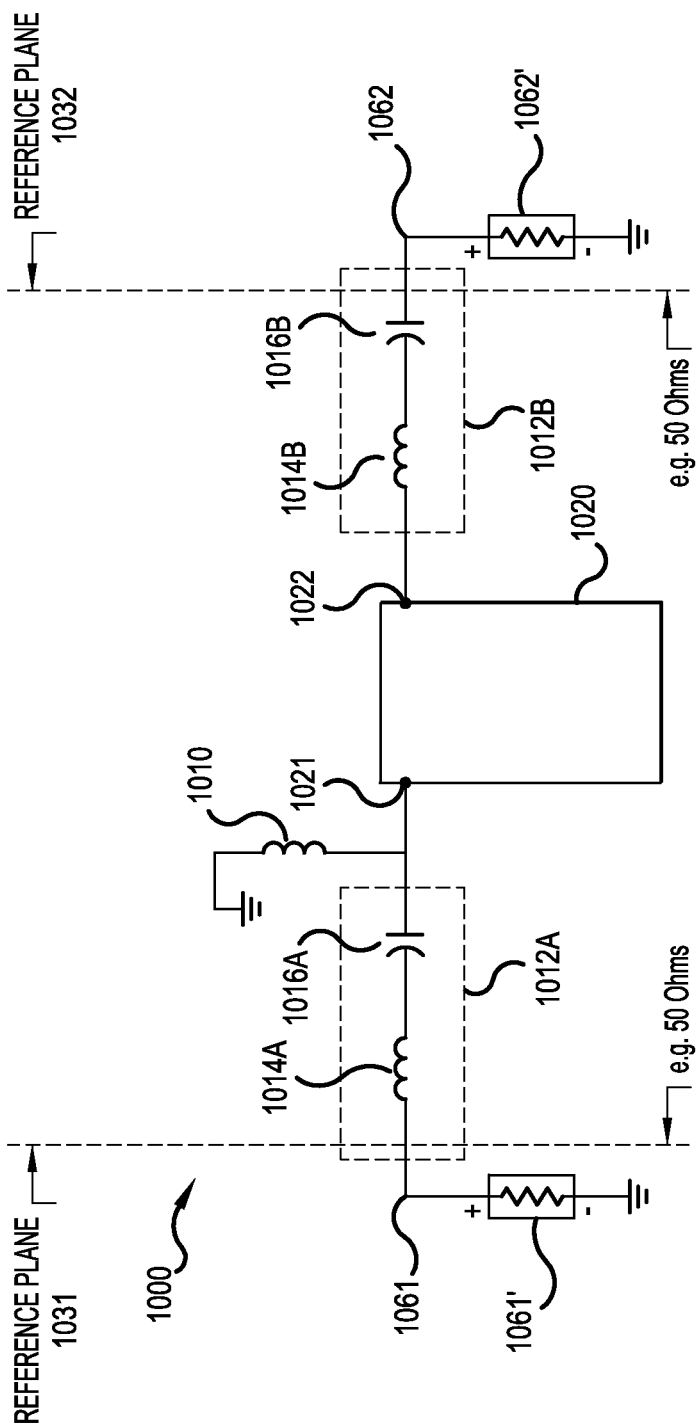
FIG. 10 is a simplified block diagram illustrating LC series resonance circuits on both sides of a solid state switch for matching devices with the same impedance, according to a representative embodiment.

FIG. 10 is a simplified block diagram illustrating LC series resonance circuits on both sides of a solid state switch for matching devices with the same impedance, according to a representative embodiment.

Referring to FIG. 10, matching circuit 1000 is configured to provide broadband impedance matching of a solid state switch 1020 (or other comparable inherently capacitive device) at input port 1021 and output port 1022 for processing RF signals in a broadband frequency range or in multiple limited frequency bands within a composite broadband frequency range. Impedance 1061' of port 1061 and impedance 1062' of port 1062 are equal to one another (e.g., each about 50 ohms).

In the depicted embodiment, the matching circuit 1000 includes a shunt inductor 1010 and two LC series resonance circuits, including first LC series resonance circuit 1012A and second LC series resonance circuit 1012B, each of which has a corresponding series resonance frequency. The first LC series resonance circuit 1012A is connected to the input port 1021 of the solid state switch 1020, and the second LC series resonance circuit 1012B is connected to the output port 1022 of the solid state switch 1020. The first LC series resonance circuit 1012A includes a first inductor 1014A and a first capacitor 1016A as series elements, and the second LC series resonance circuit 1012B includes a second inductor 1014B and a second capacitor 1016B as series elements. These series elements can be arranged in any order with respect to one another. In the depicted embodiment, one end of the shunt inductor 1010 is connected between the first LC series resonance circuit 1012A and the input port 1021, and the other end of the shunt inductor 1010 is connected to reference ground. Alternatively, the shunt inductor 1010 may be on the opposite side, such that one end of the shunt inductor 1010 is connected between output port 1022 and the second LC series resonance circuit 1012B, and the other end of the shunt inductor 1010 is connected to reference ground, without departing from the scope of the present teachings.

Figure 11A:
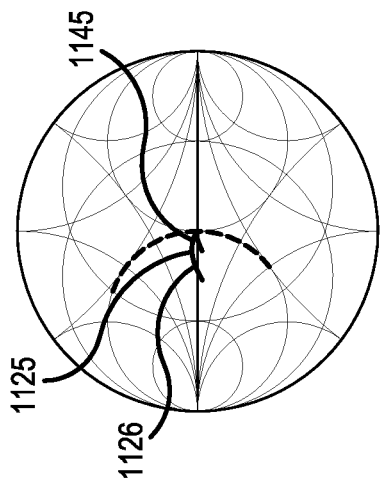
FIG. 11A is a Smith chart showing return loss of a solid state switch in an ON state, with a matching circuit configured as shown in FIG. 10, according to a representative embodiment.

FIG. 11A is a Smith chart showing return loss of the solid state switch 1020, with matching circuit 1000 configured as shown in FIG. 10. The first and second series resonance circuits 1012A and 1012B, in addition to the shunt inductor 1010, transform the impedance further than shown in the Smith chart of FIG. 4A, for example. The compensation provided by the additional LC series resonance circuits (1012A, 1012B) is indicated by loop 1145 in the Smith chart. The functional principle of the LC series resonance circuits (1012A, 1012B) is essentially the same as described above (e.g., with reference to FIGS. 4A-4C), but is applied to both the input and output ports 1021 and 1022 of the solid state switch 1020. The loop 1145, as well as curves 1125 and 1126 in FIG. 11B below (which are substantially same), is around the matching point in the Smith chart of FIG. 11A for frequencies to be matched, thus indicating that the impedance transformation to 50 ohms works.

Figure 11C:
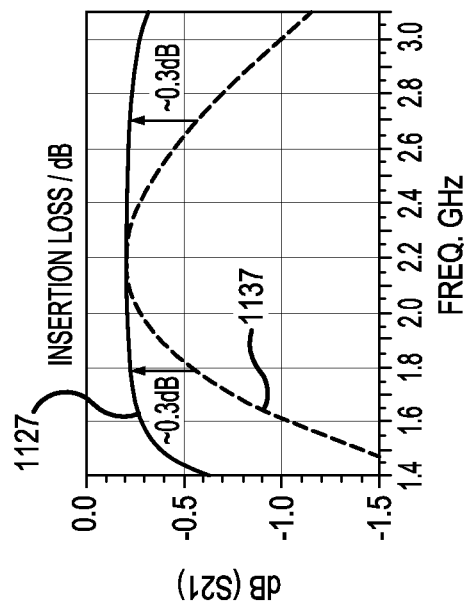
FIG. 11C is a graph showing insertion loss of the matched solid state switch in on state of FIG. 10 as a function of frequency, according to a representative embodiment.
Figure 11B:
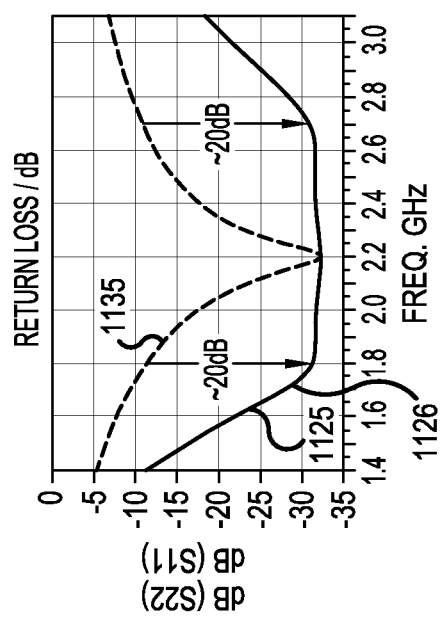
FIG. 11B is a graph showing return loss of the matched solid state switch in an ON state of FIG. 10 as a function of frequency, according to a representative embodiment.

FIG. 11B is a graph showing return loss of the matched solid state switch 1020 in dB as a function of frequency in GHz, and FIG. 11C is a graph showing insertion loss of the matched solid state switch 1020 in dB as a function of frequency in GHz. Referring to FIG. 11B, curve 1125 indicates the return loss of the solid state switch 1020 at reference plane 1031 (S-parameter $S_{11}$), as well as at the reference plane 1032 (S-parameter $S_{22}$). For purposes of comparison, dashed curve 1135 is provided in FIG. 11B to indicate the return losses of the conventional matched solid state switch 120 (as shown in FIG. 2B), which is substantially the same at the reference plane 131 and the reference plane 132. Curve 1125 shows an improvement in return loss of about 20 dB at about 1.8 GHz and about 2.7 GHz, and shows a very low ripple (smooth curve) in the complete passband of the broadband frequency range as compared to dashed curve 1135, due to the additional first and second LC series resonance circuits 1012A, 1012B.

Similarly, referring to FIG. 11C, curve 1127 indicates the insertion loss of the matched solid state switch 1020 from port 1061 to port 1062 (S-parameter $S_{21}$). For purposes of comparison, dashed curve 1137 is provided to indicate the insertion loss of the conventional matched solid state switch 120 from port 161 to port 162 of FIG. 1B. Curve 1127 shows an improvement in insertion loss of about 0.3 dB at about 1.8 GHz and about 2.7 GHz of the broadband frequency range, as compared to dashed curve 1137, due to the additional LC series resonance circuits 1012A, 1012B.

Figure 12:
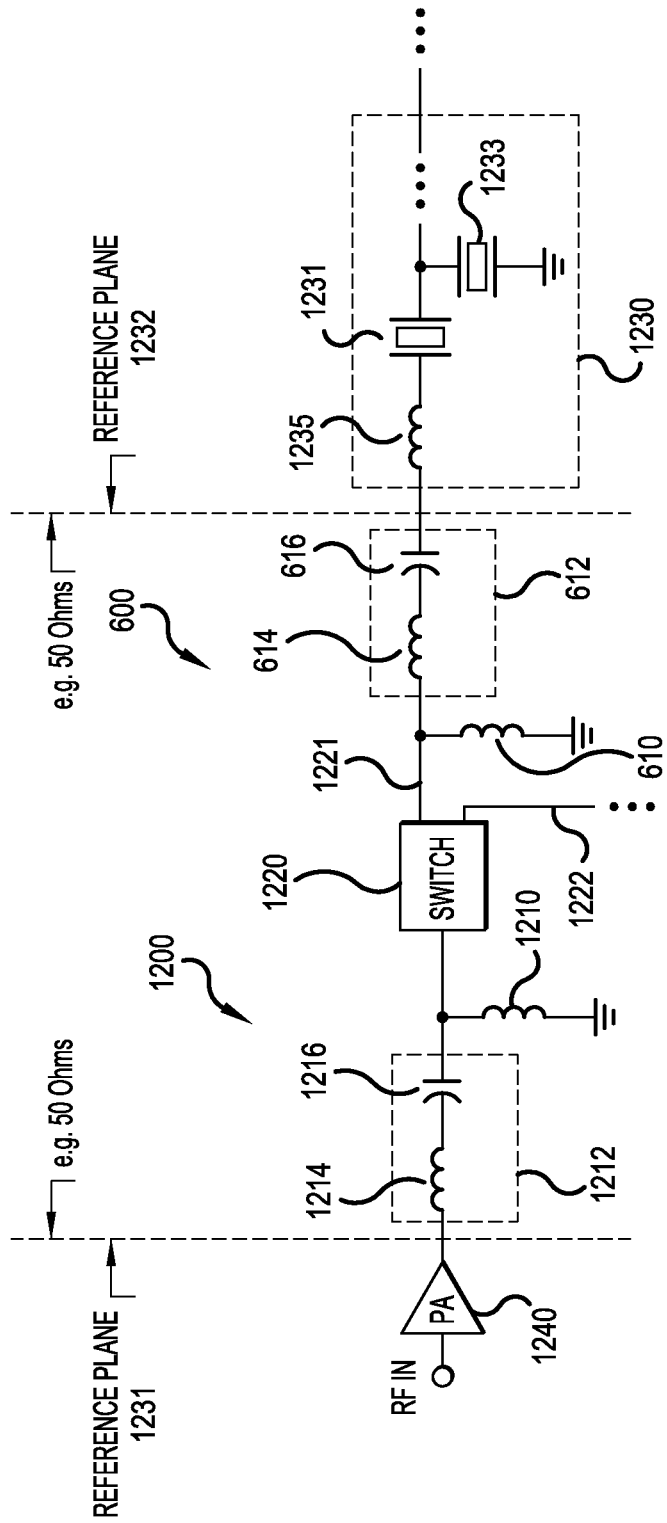
FIG. 12 is a simplified block diagram illustrating a matching circuit for matching devices with the same impedances, according to a representative embodiment.

FIG. 12 is a simplified block diagram illustrating an exemplary system or module with multiple matching circuits, according to a representative embodiment.

Referring to FIG. 12, the exemplary system or module includes two matching circuits, matching circuit 600 (e.g., as shown in FIG. 7) and matching circuit 1200, configured to provide broadband impedance matching of a solid state switch 1220 with both an acoustic filter, indicated by representative thin film bulk acoustic resonator (FBAR) filter 1230, and a power amplifier 1240. Of course, the solid state switch 1220 may be another type of comparable inherently capacitive device, and the FBAR filter 1230 and the power amplifier 1240 may be other types of filters, amplifiers or other electrical components, respectively, without departing from the scope of the present teachings. For example, the FBAR filter 1230 may be replaced by any kind of bulk acoustic wave (BAW) resonator filter. Also, FIG. 12 depicts a general case, although in various configurations, one of the shunt inductors (e.g., shunt inductor 610 or shunt inductor 1210) may be omitted so that the system effectively becomes the matching circuit 1000 shown in FIG. 10. As discussed above with reference to FIG. 7, the impedance of the solid state switch 1220 is different from the impedances of the FBAR filter 1230 and the power amplifier 1240, thus requiring implementation of the matching circuits 600 and 1200, respectively.

In the depicted embodiment, the matching circuit 600 includes the shunt inductor 610 and the LC series resonance circuit 612 connected between the solid state switch 1220 and the FBAR filter 1230, and the LC series resonance circuit 612 includes the inductor 614 and the capacitor 616 connected in series, as discussed above. The description of the matching circuit 600 therefore will not be repeated.

Similar to the matching circuit 600, the matching circuit 1200 includes a shunt inductor 1210 and an LC series resonance circuit 1212, which has a corresponding series resonance frequency. The matching circuit 1200 is connected between the solid state switch 1220 and the power amplifier 1240. The LC series resonance circuit 1212 includes an inductor 1214 and a capacitor 1216 as series elements. One end of the shunt inductor 1210 is connected between the LC series resonance circuit 1212 and the solid state switch 1220 and the other end of the shunt inductor 1210 is connected to reference ground. As discussed above, the shunt inductor 1210 is configured to transform impedance at a matching resonance frequency to the matching point in a Smith chart. The matching resonance frequency is in the frequency band to be matched, typically somewhere in the middle portion. Therefore, the imaginary part of the impedance of the solid state switch 1220 is still capacitive (although less capacitive) for frequencies greater than the matching resonance frequency, and the impedance is now inductive for frequencies less than the matching resonance frequency, as discussed above with reference to the matching circuit 600.

The LC series resonance circuit 1212 of the matching circuit 1200 is configured to further transform the matching impedance of the solid state switch 1220 and the shunt inductor 1210 to a design matching impedance corresponding to the broadband frequency range, which may be different from the broadband frequency range covered by the matching circuit 600. To accomplish this, the LC series resonance circuit 1212 acts as a capacitive element for frequencies less than its series resonance frequency, and acts as an inductive element for frequencies greater than its series resonance frequency. Accordingly, the addition of the inductor 1214 and the capacitor 1216 as the LC series resonance circuit 1212 achieves the required broadband matching. The series resonance frequency of the LC series resonance circuit 1212 is in the frequency band to be matched, typically in the middle portion.

Generally, the solid state switch 1220 receives an RF input signal (e.g., which may include frequencies from one or more multiple bands), which has been amplified by the power amplifier 1240, via the matching circuit 1200. The solid state switch 1220 includes at least two outputs, indicated by representative output ports 1221 and 1222. In the depicted example, the output port 1221 is connected to the FBAR filter 1230 via the matching circuit 600. The output port 1222 may be connected to another filter (FBAR or otherwise, or to some other electronic device) via another matching circuit (not shown). Of course, the number of outputs of the solid state switch 1220, as well as the types of electronic devices to which they connect, may vary without departing from the scope of the present teachings.

Referring to the LC series resonance circuit 1212, the inductor 1214 is referred to as an "inductor" for the sake of convenience, although it is understood that the inductor 1214 (as well as any other "inductor" identified in the present disclosure) may be implemented by any element(s) having primarily inductive characteristics, such as a transmission line, a bondwire and/or an inductor, for example, depending on the exact value needed to accommodate the matching functionality, as mentioned above. Similarly, the capacitor 1216 is referred to as a "capacitor" for the sake of convenience, although it is understood that the capacitor 1216 (as well as any other "capacitor" identified in the present disclosure) may be implemented by any element(s) have primarily capacitive characteristics. In FIG. 12, the inductor 1214 is depicted as a single series inductor, although in alternative configurations, the inductor 1214 may be implemented by two or more series inductors, which may be connected directly to one another or connected to opposite ends of the capacitor 1216. Alternatively, the inductor 1214 may be implemented, at least in part, by a series inductor that is already in the output matching circuit of the power amplifier 1240, e.g., using a higher value of SMD chip inductor.

Notably, the capacitor 1216 in FIG. 12 also acts as DC block. Therefore no additional blocking capacitor is needed for the power amplifier 1240. Also, use of a solid state technology, such as complementary metal-oxide semiconductor (CMOS), for the solid state switch 1220 allows easy and accurate implementation of capacitors. The capacitor 1216 could therefore be implemented inside the solid state switch 1220, for example. The capacitor 1216 may alternatively be implemented inside the power amplifier 1240 when the relative positions of the capacitor 1216 and the inductor 1214 are swapped.

In the depicted embodiment, the FBAR filter 1230 is shown to include representative series FBAR 1231 and representative shunt FBAR 1233. The number and positions of series and/or shunt FBARs of the FBAR filter 1230 may vary to provide unique benefits for any particular situation or to meet application specific design requirements of various implementations, as would be apparent to one skilled in the art. The FBAR filter 1230 also includes an inductor 1235 at the input, which is typically used to match impedance of the FBAR filter 1230.

When the relative positions of the capacitor 616 and the inductor 614 of the LC series resonance circuit 612 are swapped, or when the relative positions of the capacitor 616 and the series inductor 1235 are swapped, the inductor 614 may be implemented together with the series inductor 1235 as one component. This may be accomplished, for example, using a higher value of SMD chip inductor. Also, in alternative configurations, the capacitor 616 may shifted to the FBAR filter 1230 die, for example. That is, when the capacitor 616 and the series inductor 1235 swap relative positions, the capacitor 616 may be implemented as a separate resonator that is acoustically inactive at the operation frequency of the FBAR filter 1230, for example. Similarly, when the capacitor 616 and the inductor 614 swap relative positions, the capacitor 616 may be implemented inside the solid state switch 1220.

FIG. 13 is a simplified block diagram illustrating a matching circuit of a solid state switch for matching devices with the different impedances, according to a representative embodiment. The matching circuit includes an additional series element in series with the series resonance circuit in order to match the different impedances.

Referring to FIG. 13, matching circuit 1300 is configured to provide broadband impedance matching of a solid state switch 1320 (or other comparable inherently capacitive device) at input port 1321 and output port 1322 for processing RF signals in a broadband frequency range, which may include a single broadband frequency band or multiple limited frequency bands within a composite broadband frequency range. In depicted embodiment, the impedance 1361' of port 1361 and impedance 1362' of port 1362 are different from one another, where the impedance 1361' is the low impedance (e.g., about 30 ohms) side and the impedance 1362' is the high impedance (e.g., about 50 ohms) side. Thus, the matching circuit 1300 is configured to compensate for the capacitive behavior of the solid state switch and additionally to perform low to high impedance transformation.

The matching circuit 1300 includes a shunt inductor 1310 and an LC series resonance circuit 1312, which has a corresponding series resonance frequency, and an additional series inductor 1317, connected to the input port 1321 of the solid state switch 1320 (on the low impedance side). The LC series resonance circuit 1312 includes an inductor 1314 and a capacitor 1316 as series elements (arranged in any order). In the depicted embodiment, one end of the shunt inductor 1310 is connected between the LC series resonance circuit 1312 and the additional series inductor 1317, and the other end of the shunt inductor 1310 is connected to reference ground.

Figure 14C:
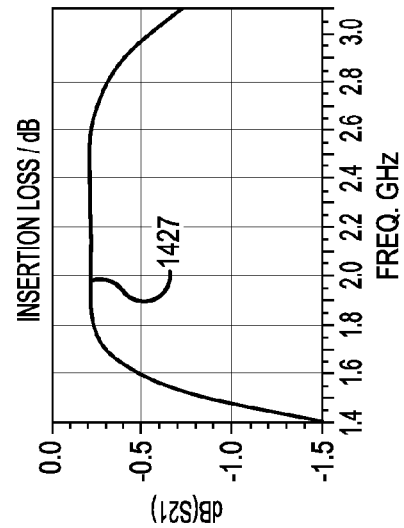
FIG. 14C is a graph showing insertion loss of the matched solid state switch in an ON state of FIG. 13 as a function of frequency, according to a representative embodiment.
Figure 14A:
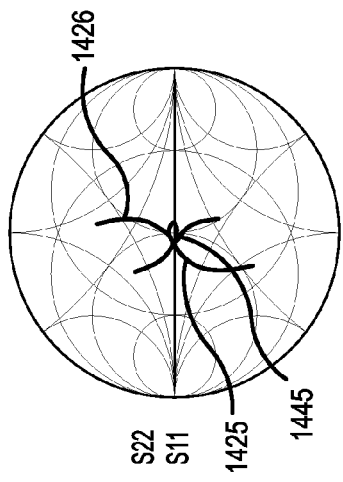
FIG. 14A is a Smith chart showing return loss of a solid state switch in an ON state, with a matching circuit configured as shown in FIG. 13, according to a representative embodiment.

FIG. 14A is a Smith chart showing return loss of the solid state switch 1320, with matching circuit 1300 configured as shown in FIG. 13 at reference plane 1331 corresponding to port 1361. The series resonance circuit 1312 and the additional series inductor 1317 will at least partially compensate for the inductive and capacitive behavior of the inherently capacitive solid state switch 1320, together with the shunt inductor 1310. This compensation is indicated by loop 1445 in the Smith chart, formed and shifted due to the series resonance circuit 1312 and the additional series inductor 1317.

Figure 14B:
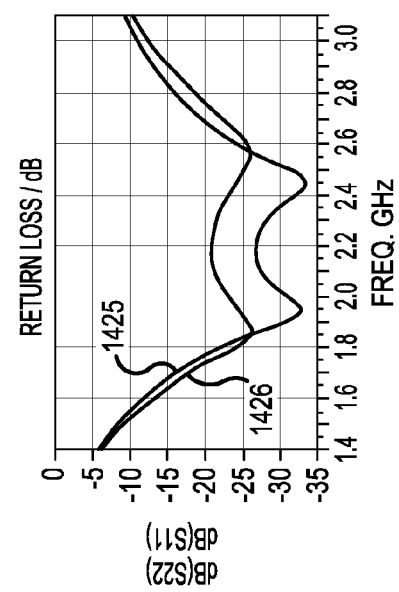
FIG. 14B is a graph showing return loss of the matched solid state switch in an ON state of FIG. 13 as a function of frequency, according to a representative embodiment.

FIG. 14B is a graph showing return loss of the matched solid state switch 1320 in dB as a function of frequency in GHz, and FIG. 14C is a graph showing insertion loss of the matched solid state switch 1320 in dB as a function of frequency in GHz. Referring to FIG. 14A, curve 1425 indicates the return loss of the solid state switch 1320 at reference plane 1331 corresponding to port 1361 (S-parameter $S_{11}$), and curve 1426 indicates the return loss of the solid state switch 1320 at reference plane 1332 corresponding to port 1362 (S-parameter $S_{22}$). The loop 1445, and the curves 1425 and 1426 are around the matching point in the Smith chart shown in FIG. 14A for frequencies to be matched, thus indicating that the impedance transformation from 30 ohms to 50 ohms works. Referring to FIG. 14C, curve 1427 indicates the insertion loss of the solid state switch 1320 from port 1361 to port 1362 (S-parameter $S_{21}$).

FIG. 15 is a simplified block diagram illustrating LC series resonance circuits on both sides of a solid state switch for matching devices with different impedances, according to a representative embodiment. That is, the matching circuit includes two LC series resonance circuits, one of which is in series with an additional series element as discussed above with reference to FIG. 13 in order to match the different impedances.

Referring to FIG. 15, matching circuit 1500 is configured to provide broadband impedance matching of a solid state switch 1520 (or other comparable inherently capacitive device) at input port 1521 and output port 1522 for processing RF signals in a broadband frequency range. In depicted embodiment, the impedance 1561' of port 1561 and impedance 1562' of port 1562 are different from one another, where the impedance 1561' is the low impedance (e.g., about 30 ohms) side and the impedance 1562' is the high impedance (e.g., about 50 ohms) side. Thus, the matching circuit 1500 is configured to perform low to high impedance transformation.

The matching circuit 1500 includes a shunt inductor 1510, a first LC series resonance circuit 1512A and an additional series inductor 1517 connected to the input port 1521 and port 1561, and a second LC series resonance circuit 1512B connected to the output port 1522 and port 1562. Each of the first and second LC series resonance circuits 1512A and 1512B has a corresponding series resonance frequency. The first LC series resonance circuit 1512A is configured substantially the same as the LC series resonance circuit 1312 shown in FIG. 13 for transforming between low and high impedances. That is, the first LC series resonance circuit 1512A includes an inductor 1514A and a capacitor 1516A as series elements (arranged in any order). The additional series inductor 1517 may be considered an additional series element within the matching circuit 1500. In the depicted embodiment, one end of the shunt inductor 1510 is connected between the first LC series resonance circuit 1512A and the additional series inductor 1517, and the other end of the shunt inductor 1510 is connected to reference ground. The second LC series resonance circuit 1512B includes an inductor 1514B and a capacitor 1516B (arranged in any order).

Figure 16A:
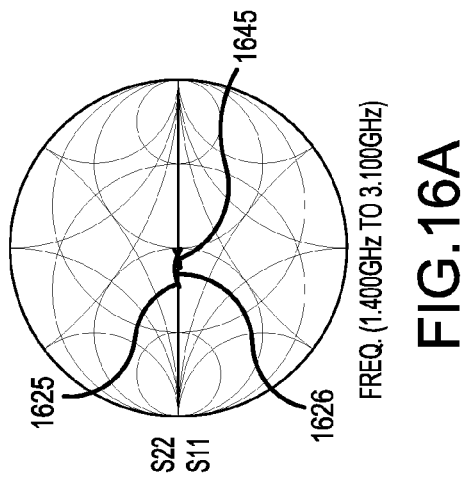
FIG. 16A is a Smith chart showing return loss of a solid state switch in an ON state, with a matching circuit configured as shown in FIG. 15, according to a representative embodiment.

FIG. 16A is a Smith chart showing return loss of the matched solid state switch 1520, with matching circuit 1500 configured as shown in FIG. 15. The first LC series resonance circuit 1512A and the additional series inductor 1517, as well as the second LC series resonance circuit 1512B will at least partially compensate for the inductive and capacitive behavior of the inherently capacitive solid state switch 1520, together with the shunt inductor 1510. This compensation is indicated by loop 1645 in the Smith chart, formed and shifted due to the first and second LC series resonance circuits 1512A and 1512B, and the additional series inductor 1517. In addition, curve 1625 indicates the return loss of the solid state switch 1520 at reference plane 1531 corresponding to port 1561 (S-parameter $S_{11}$), and curve 1526 indicates the return loss of the solid state switch 1520 at reference plane 1532 corresponding to port 1562 (S-parameter $S_{22}$). The loop 1645, and the curves 1625 and 1626 are around the matching point in the Smith chart for frequencies to be matched, thus indicating that the impedance transformation from 30 ohms to 50 ohms works.

Figure 16C:
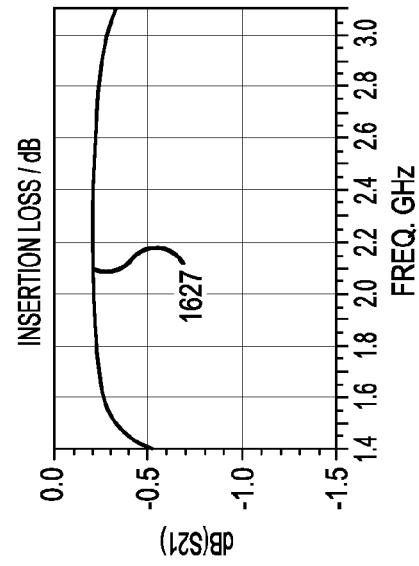
FIG. 16C is a graph showing insertion loss of the matched solid state switch in an ON state of FIG. 15 as a function of frequency, according to a representative embodiment.
Figure 16B:
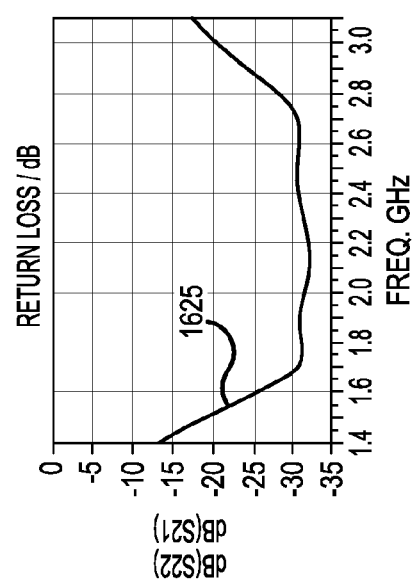
FIG. 16B is a graph showing return loss of the matched solid state switch in an ON state of FIG. 15 as a function of frequency, according to a representative embodiment.

FIG. 16B is a graph showing return loss of the matched solid state switch 1520 in dB at reference plane 1531 corresponding to port 1561 and reference plane 1532 corresponding to port 1562, respectively, as a function of frequency in GHz, and FIG. 16C is a graph showing insertion loss of the matched solid state switch 1520 in dB as a function of frequency in GHz. Referring to FIG. 16B, curve 1625 indicates the return loss of the matched solid state switch 1520 at reference plane 1531 (S-parameter $S_{11}$) and at reference plane 1532 (S-parameter $S_{22}$), which are substantially the same. Referring to FIG. 16C, curve 1627 indicates the insertion loss of the matched solid state switch from port 1561 to port 1562 (S-parameter $S_{21}$). Accordingly, one is able to improve matching by providing an additional LC series resonance circuit (1512A, 1512B), at both sides of the solid state switch 1520, by unequal port impedances. In the depicted example, the improvement includes an approximate 10 dB better return loss and a very low ripple (smooth curve) in the complete passband of the composite broadband frequency range.

Figure 17:
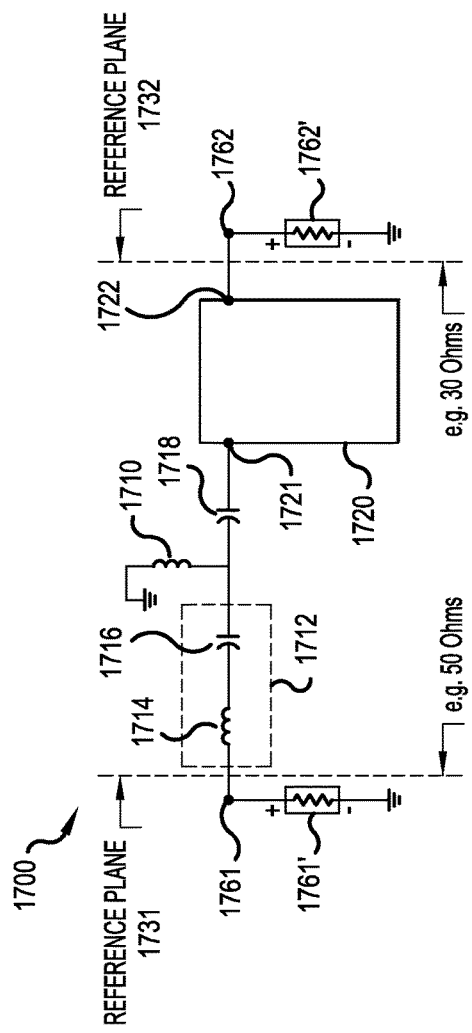
FIG. 17 is a simplified block diagram illustrating a matching circuit of a solid state switch for matching a device with different impedances, according to a representative embodiment.

FIG. 17 is a simplified block diagram illustrating a matching circuit of a solid state switch for matching devices with the different impedances, according to a representative embodiment. The matching circuit includes an additional series element in series with the series resonance circuit in order to match the different impedances.

Referring to FIG. 17, matching circuit 1700 is configured to provide broadband impedance matching of a solid state switch 1720 (or other comparable inherently capacitive device) at input port 1721 and output port 1722 for processing RF signals in a broadband frequency range. In depicted embodiment, the impedance 1761' corresponding to port 1761 and impedance 1762' corresponding to port 1762 are different from one another, where the impedance 1761' is the high impedance (e.g., about 50 ohms) side and the impedance 1762' is the low impedance (e.g., about 30 ohms) side. Thus, the matching circuit 1700 is configured to perform high to low impedance transformation.

The matching circuit 1700 includes a shunt inductor 1710, an LC series resonance circuit 1712, which has a corresponding series resonance frequency, and an additional series capacitor 1718 connected to the input port 1721 of the solid state switch 1720 (on the high impedance side). The LC series resonance circuit 1712 includes an inductor 1714 and a capacitor 1716 as series elements (arranged in any order). In the depicted embodiment, one end of the shunt inductor 1710 is connected between the LC series resonance circuit 1712 and the additional series capacitor 1718, and the other end of the shunt inductor 1710 is connected to reference ground.

FIG. 18A is a Smith chart showing return loss of the solid state switch 1720, with matching circuit 1700 at reference plane 1731 corresponding to port 1761 and reference plane 1732 corresponding to port 1762, respectively, configured as shown in FIG. 17. The LC series resonance circuit 1712 will at least partially compensate for the inductive and capacitive behavior of the inherently capacitive solid state switch 1720, together with the shunt inductor 1710. This compensation is indicated by loop 1845 in the Smith chart, formed due to the LC series resonance circuit 1712. In addition, curve 1825 indicates the return loss of the solid state switch 1720 at reference plane 1731 (S-parameter $S_{11}$), and curve 1826 indicates the return loss of the solid state switch 1720 at reference plane 1732 (S-parameter $S_{22}$). The loop 1845, and the curves 1825 and 1826 are around the matching point in the Smith chart for frequencies to be matched, thus indicating that the impedance transformation from 50 ohms to 30 ohms works.

FIG. 18B is a graph showing return loss of the matched solid state switch 1720 in dB at reference plane 1731 and reference plane 1732, respectively, as a function of frequency in GHz, and FIG. 18C is a graph showing insertion loss of the matched solid state switch 1820 in dB as a function of frequency in GHz. Referring to FIG. 18B, curve 1825 indicates the return loss of the solid state switch 1720 at reference plane 1731 (S-parameter $S_{11}$), and curve 1826 indicates the return loss of the solid state switch 1720 at the reference plane 1732 (S-parameter $S_{22}$). Referring to FIG. 18C, curve 1827 indicates the insertion loss of the matched solid state switch 1720 from port 1761 to port 1762 (S-parameter $S_{21}$).

Figure 19:
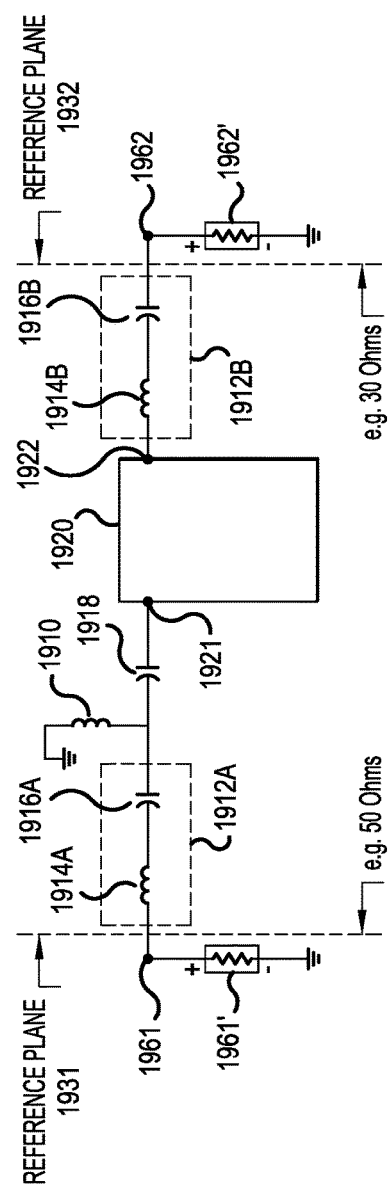
FIG. 19 is a simplified block diagram illustrating LC series resonance circuits on both sides of a solid state switch for matching devices with different impedances, according to a representative embodiment.

FIG. 19 is a simplified block diagram illustrating LC series resonance circuits on both sides of a solid state switch for matching devices with different impedances, according to a representative embodiment. That is, the matching circuit includes two LC series resonance circuits, one of which is connected in series with an additional series element as discussed above with reference to FIG. 17 in order to match the different impedances.

Referring to FIG. 19, matching circuit 1900 is configured to provide broadband impedance matching of a solid state switch 1920 (or other comparable inherently capacitive device) at input port 1921 and output port 1922 for processing RF signals in a broadband frequency range. In the present embodiment, it is assumed that impedance 1961' of port 1961 and impedance 1962' of port 1962 are different from one another, where the impedance 1961' is the high impedance (e.g., about 50 ohms) side and the impedance 1962' is the low impedance (e.g., about 30 ohms) side. Thus, the matching circuit 1900 is configured to perform high to low impedance transformation.

The matching circuit 1900 includes a shunt inductor 1910, a first LC series resonance circuit 1912A and an additional series capacitor 1918 connected to the input port 1921, and a second LC series resonance circuit 1912B connected to the output port 1922. Each of the first and second LC series resonance circuits 1912A and 1912B has a corresponding series resonance frequency. The first LC series resonance circuit 1912A is configured substantially the same as the LC series resonance circuit 1712 shown in FIG. 17 for transforming between high and low impedances. That is, the first LC series resonance circuit 1912A includes an inductor 1914A and a capacitor 1916A as series elements (arranged in any order). In the depicted embodiment, one end of the shunt inductor 1910 is connected between the first LC series resonance circuit 1912A and the additional series capacitor 1918, and the other end of the shunt inductor 1910 is connected to reference ground. The second LC series resonance circuit 1912B includes an inductor 1914B and a capacitor 1916B as series elements (arranged in any order).

FIG. 20A is a Smith chart showing return loss of the solid state switch 1920, with matching circuit 1900 configured as shown in FIG. 19. The first and second LC series resonance circuits 1912A and 1912B will at least partially compensate for the inductive and capacitive behavior of the inherently capacitive solid state switch 1920, together with the shunt inductor 1910. This compensation is indicated by loop 2045 in the Smith chart, formed and shifted due to the first and second LC series resonance circuits 1912A and 1912B, and the additional series capacitor 1918. In addition, curve 2025 indicates the return loss of the solid state switch 1920 at reference plane 1931 (S-parameter $S_{11}$), and curve 2026 indicates the return loss of the solid state switch 1920 at reference plane 1932 (S-parameter $S_{22}$). The loop 2045, and the curves 2025 and 2026 are around the matching point in the Smith chart for frequencies to be matched, thus indicating that the impedance transformation from 50 ohms to 30 ohms works.

FIG. 20B is a graph showing return loss of the matched solid state switch 1920 in dB as a function of frequency in GHz, and FIG. 20C is a graph showing insertion loss of the matched solid state switch 1920 in dB as a function of frequency in GHz. Referring to FIG. 20B, curve 2025 indicates the return loss of the matched solid state switch 1920 at reference plane 1931 (S-parameter $S_{11}$) and curve 2026 indicates the return loss of the matched solid state switch 1920 at reference plane 1932 (S-parameter $S_{22}$). Referring to FIG. 20C, curve 2027 indicates the insertion loss of the solid state switch 1920 between port 1961 and port 1962 (S-parameter $S_{21}$). Accordingly, one is able to improve matching by providing an additional LC series resonance circuit (1912A, 1912B), at both sides of the solid state switch 1920, by unequal port impedances.

Figure 21:
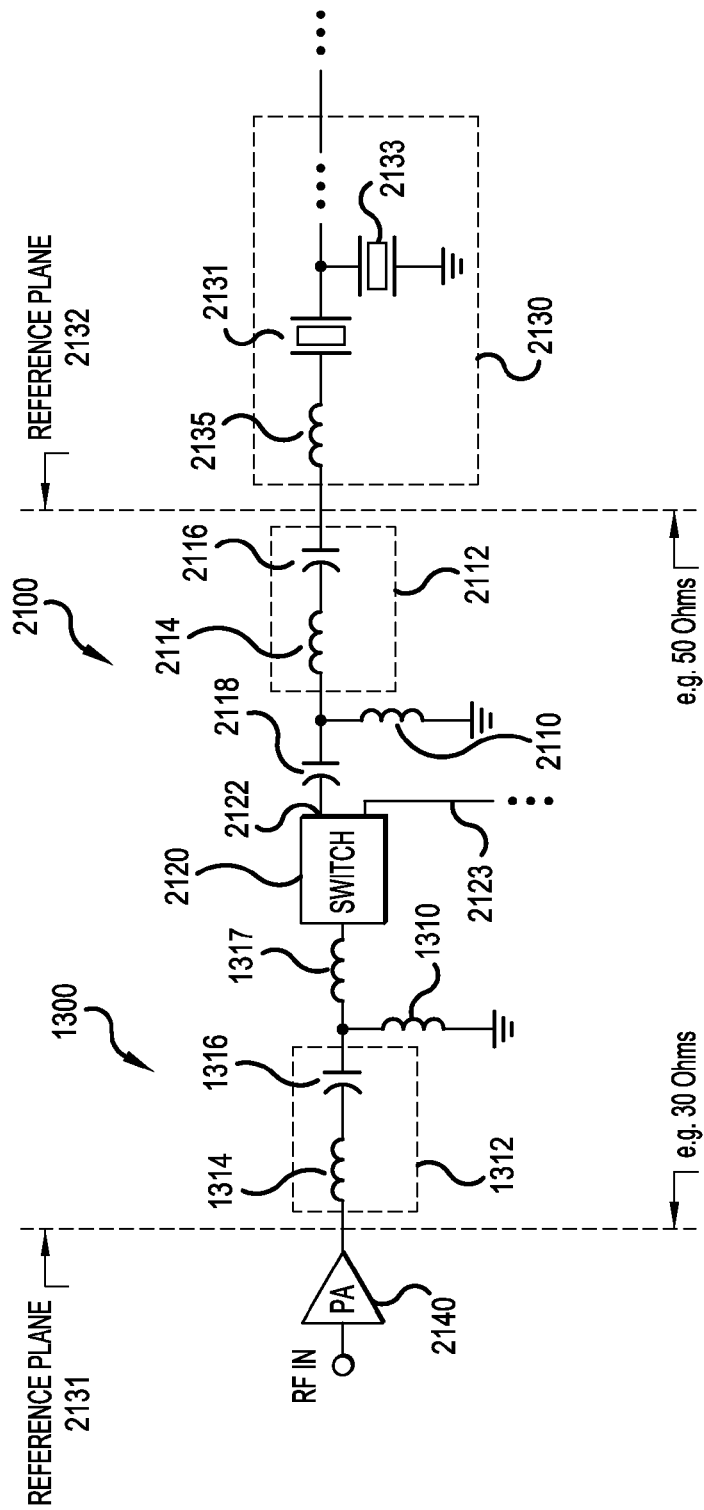
FIG. 21 is a simplified block diagram illustrating an exemplary system or module with multiple matching circuits for matching devices with different impedances, according to a representative embodiment.

FIG. 21 is a simplified block diagram illustrating an exemplary system or module with multiple extended matching circuits for matching devices with different impedances, according to a representative embodiment.

Referring to FIG. 21, the exemplary system or module includes two matching circuits, matching circuit 1300 and matching circuit 2100, configured to provide broadband impedance matching of a solid state switch 2120 with both a filter, indicated by representative FBAR filter 2130, and a power amplifier 2140. Of course, the solid state switch 2120 may be another type of comparable inherently capacitive device, and the FBAR filter 2130 and the power amplifier 2140 may be other types of filters, amplifiers or other electrical devices, respectively, without departing from the scope of the present teachings. As discussed above, the impedance of the solid state switch 2120 is different from the impedances of the FBAR filter 2130 (e.g., 50 Ohms) and the power amplifier 2140 (e.g., 30 Ohms), thus requiring matching circuits 1300 and 2100.

In the depicted embodiment, the matching circuit 1300 is connected between the power amplifier 2140 and the solid state switch 2120, and is configured to perform low to high impedance transformation. The matching circuit 1300 includes the shunt inductor 1310, the LC series resonance circuit 1312, which has the inductor 1314 and the capacitor 1316 as series elements, and additional series inductor 1317, as discussed above with reference to FIG. 13. Further description of the matching circuit 1300 therefore will not be repeated.

Similar to the matching circuit 1300, the matching circuit 2100 includes a shunt inductor 2110, an LC series resonance circuit 2112, and an additional series capacitor 2118. The matching circuit 2100 is connected between the solid state switch 1220 and the FBAR filter 2130, and is configured to perform low to high impedance transformation. The LC series resonance circuit 2112 has a corresponding resonance frequency, and includes a capacitor 2116 and an inductor 2114 as series elements (arranged in any order). One end of shunt inductor 2110 is connected between the additional series capacitor 2118 and the LC series resonance circuit 2112, and the other end of the shunt inductor 2110 is connected to reference ground. As discussed above, the shunt inductor 2110 is configured to transform impedance at a matching resonance frequency to the matching point in a Smith chart. The matching resonance frequency is in the frequency band to be matched, typically somewhere in a middle portion of the frequency band to be matched. Therefore, the imaginary part of the impedance of the solid state switch 2120 is still capacitive (although less capacitive) for frequencies greater than the matching resonance frequency, and the impedance is now inductive for frequencies less than the matching resonance frequency.

The solid state switch 2120 receives an RF input signal (e.g., with multiple bands), which has been amplified by the power amplifier 2140, via the matching circuit 1300. The solid state switch 2120 includes at least two outputs, indicated by representative output lines 2122 and 2123. In the depicted example, the output line 2122 is connected to the FBAR filter 2130 via the matching circuit 2100. The output line 2123 may be connected to another filter (or other electronic device) via another matching circuit (not shown). Of course, the number of outputs of the solid state switch 2120, as well as the types of electronic devices to which they connect, may vary without departing from the scope of the present teachings.

The capacitor 1316 also acts as DC block. Therefore no additional blocking capacitor is needed for the power amplifier 2140. Also, use of a solid state technology, such as CMOS, for the solid state switch 2120 allows easy and accurate implementation of capacitors. The additional series capacitor 2118 could therefore be implemented inside the solid state switch 2120, for example.

In the depicted embodiment, the FBAR filter 2130 is shown to include representative series FBAR 2131 and representative shunt FBAR 2133. The number and positioning of series and/or shunt FBARs of the FBAR filter 2130 may vary to provide unique benefits for any particular situation or to meet application specific design requirements of various implementations, as would be apparent to one skilled in the art. The FBAR filter 2130 also includes a series inductor 2135 at the input, which is typically used to match impedance of the FBAR filter 2130.

If the relative positions of the capacitor 2116 and the inductor 2114 of the LC series resonance circuit 2112 were swapped, or if the relative positions of the capacitor 2116 and the series inductor 2135 were swapped, the inductor 2114 may be implemented together with the series inductor 2135 as one component. This may be accomplished, for example, using a higher value of SMD chip inductor. Also, in alternative configurations, the capacitor 2116 may shifted to the FBAR filter 2130 die, for example. When the capacitor 2116 and the series inductor 2135 swap relative positions, the capacitor 2116 may be implemented as a separate resonator that is acoustically inactive at the operation frequency of the FBAR filter 2130, for example. Notably, in alternative configurations, the impedance of the power amplifier 2140 may be the same as that of the FBAR filter 2130, in which case the additional series inductor 1317 and the additional series capacitor 2118 may be omitted, and the circuit effectively becomes the circuit shown in FIG. 12, for example, described above. Of course, one of the matching circuits 1300 or 2100 may be omitted, depending on the particular matching requirements. If only one of the matching circuits 1300 or 2100 is used, it may be arranged at the common port of the solid state switch 2120, so that only one of the implemented matching circuits 1300 or 2100 is needed, thus providing a more compact implementation due to fewer components. On the other hand, if the implemented matching circuit 1300 or 2100 is arranged at each output port of the solid state switch 2120, it has the advantage of individual tuning opportunities for several paths.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

What is claimed:

1. A matching circuit enabling broadband impedance matching of an inherently capacitive device with devices having different impedances, for processing radio frequency (RF) signals in a broadband frequency range, the matching circuit comprising:
   an additional series inductor configured to transform capacitance behavior from high impedance to lower impedance;
   a shunt inductor configured to transform the lower impedance to a matching impedance at a matching resonance frequency, the matching resonance frequency being in a middle portion of the broadband frequency range; and
   a series resonance circuit having a series resonance frequency approximately the same as the matching resonance frequency, and comprising an inductor and a capacitor connected in series to the inherently capacitive device on a low impedance side, the series resonance circuit being configured to transform the matching impedance to a design matching impedance corresponding to the broadband frequency range,
   wherein the additional series inductor is connected in series between the series resonance circuit and the inherently capacitive device, and wherein one end of the shunt inductor is connected between the series resonance circuit and the additional series inductor, and another end of the shunt inductor is connected to reference ground.

2. The matching circuit of claim 1, further comprising:
   another series resonance circuit having another series resonance frequency approximately the same as the matching resonance frequency, and comprising another inductor and another capacitor connected in series to the inherently capacitive device on a side of the inherently capacitive device opposite the series resonance circuit, the other series resonance circuit being configured to further transform the matching impedance.

3. A matching circuit enabling broadband impedance matching of an inherently capacitive device with devices having different impedances, for processing radio frequency (RF) signals in a broadband frequency range, the matching circuit comprising:
   an additional series capacitor configured to transform capacitance behavior from low impedance to higher impedance;
   a shunt inductor configured to transform the higher impedance to a matching impedance at a matching resonance frequency, the matching resonance frequency being in a middle portion of the broadband frequency range; and
   a series resonance circuit having a series resonance frequency approximately the same as the matching resonance frequency, and comprising an inductor and a capacitor connected in series to the inherently capacitive device on a high impedance side, the series resonance circuit being configured to transform the matching impedance to a design matching impedance corresponding to the broadband frequency range, wherein the additional series capacitor is connected in series between the series resonance circuit and the inherently capacitive device, and wherein one end of the shunt inductor is connected between the series resonance circuit and the additional series capacitor, and another end of the shunt inductor is connected to reference ground.

4. The matching circuit of claim 3, further comprising:
another series resonance circuit having another series resonance frequency approximately the same as the matching resonance frequency, and comprising another inductor and another capacitor connected in series to the inherently capacitive device on a side of the inherently capacitive device opposite the series resonance circuit, the other series resonance circuit being configured to further transform the matching impedance.

5. A switched power amplifier duplexer (S-PAD) device having a composite broadband frequency range, the S-PAD device comprising:
a solid state switch configured to selectively connect a circuit device to one of a plurality of acoustic filters having a corresponding plurality of different frequency bands within the composite broadband frequency range;
a first matching circuit configured to match an impedance of the solid state switch and an impedance of the circuit device, the first matching circuit comprising:
a first series resonance circuit comprising a first inductor and a first capacitor connected between the solid state switch and the circuit device, the first series resonance circuit having a predetermined first resonance frequency within a middle portion of the composite broadband frequency range; and
a second matching circuit configured to match impedances of the solid state switch and one acoustic filter of the plurality of acoustic filters, the second matching circuit comprising:
a second series resonance circuit comprising a second inductor and a second capacitor connected between the solid state switch and the one acoustic filter, the second series resonance circuit having a predetermined second resonance frequency within the middle portion of the composite broadband frequency range;
wherein one of the first matching circuit and the second matching circuit further comprises a first shunt inductor, connected at one end between the solid state switch and one of the first series resonance circuit or the second series resonance circuit, respectively, and connected at an opposite end to reference ground, the first shunt inductor being configured to transform the impedance of the solid state switch to a matching impedance for a matching resonance frequency, the matching resonance frequency being within the middle portion of the composite broadband frequency range, and
wherein each of the first series resonance circuit and the second series resonance circuit is configured to further transform the matching impedance of the solid state switch and the first shunt inductor to a design matching impedance within the composite broadband frequency range.

6. The S-PAD device of claim 5, wherein the one of the first matching circuit and the second matching circuit that does not include the first shunt inductor further comprises a second shunt inductor, connected at one end between the solid state switch and one of the first series resonance circuit or the second series resonance circuit that does not include the first shunt inductor, respectively, and connected at an opposite end to reference ground.

7. The S-PAD device of claim 5, wherein, when the impedance of the circuit device and the impedance of the one acoustic filter are not equal, the first matching circuit further comprises one of:
an additional inductor connected in series with the first series resonance circuit and the solid state switch when the impedance of the circuit device is less than the impedance of the one acoustic filter; or
an additional capacitor connected in series with the first series resonance circuit and the solid state switch when the impedance of the circuit device is greater than the impedance of the one acoustic filter.

8. The S-PAD device of claim 5, wherein at least one of the first inductor and the first capacitor is implemented within the circuit device.

9. The S-PAD device of claim 5, wherein at least one of the first inductor and the first capacitor is implemented within the solid state switch.

10. The S-PAD device of claim 5, wherein the first capacitor acts as a DC block, eliminating need for a separate DC-blocking capacitor.

11. The S-PAD device of claim 5, wherein at least one of the second inductor and the second capacitor is implemented within the one acoustic filter.

12. The S-PAD device of claim 11, wherein the second inductor is implemented within the one acoustic filter, and is combinable with a matching inductor of the one acoustic filter.

13. The S-PAD device of claim 5, wherein at least one of the second inductor and the second capacitor is implemented within the solid state switch.

14. The S-PAD device of claim 5, wherein the first shunt inductor causes an imaginary part of the solid state switch impedance to be less capacitive for frequencies within the composite broadband frequency range greater than the matching resonance frequency, and to be inductive for frequencies within the composite broadband frequency range less than the matching resonance frequency.

15. The S-PAD device of claim 5, wherein the one acoustic filter comprises a thin film bulk acoustic resonator (FBAR).

16. The S-PAD device of claim 5, wherein the circuit device comprises an amplifier configured to amplify radio frequency (RF) signals within the composite broadband frequency range.

17. The S-PAD device of claim 16, wherein the amplifier is implemented outside the S-PAD device.

18. The S-PAD device of claim 5, wherein the circuit device comprises an antenna configured to at least one of receive and transmit radio frequency (RF) signals within the composite broadband frequency range.

19. The S-PAD device of claim 5, wherein the solid state switch is further configured to selectively connect the circuit device to another one of the plurality of acoustic filters, the S-PAD device further comprising:
a third matching circuit configured to match impedances of the solid state switch and the another one of the plurality of acoustic filters, the third matching circuit comprising:
a third series resonance circuit comprising a third inductor and a third capacitor connected between the solid state switch and the another one of the plurality of acoustic filters, the third series resonance circuit having a predetermined third resonance frequency within a middle portion of another broadband frequency range.

* * * * *